United States Patent
Chung et al.

(10) Patent No.: US 10,855,412 B2
(45) Date of Patent: Dec. 1, 2020

(54) CHARACTERIZATION OF IN-CHIP ERROR CORRECTION CIRCUITS AND RELATED SEMICONDUCTOR MEMORY DEVICES/MEMORY SYSTEMS

(71) Applicant: SAMSUNG ELECTRONICS CO., LTD., Suwon-si (KR)

(72) Inventors: Hoi-Ju Chung, Yongin-si (KR); Sang-Uhn Cha, Yongin-si (KR); Hyun-Joong Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/432,610

(22) Filed: Jun. 5, 2019

(65) Prior Publication Data

US 2019/0288805 A1 Sep. 19, 2019

Related U.S. Application Data

(63) Continuation of application No. 16/032,544, filed on Jul. 11, 2018, now Pat. No. 10,355,833, which is a (Continued)

(30) Foreign Application Priority Data

Jun. 29, 2015 (KR) ........................ 10-2015-0091943

(51) Int. Cl.
*H04L 1/24* (2006.01)
*G11C 29/52* (2006.01)
(Continued)

(52) U.S. Cl.
CPC ............ *H04L 1/24* (2013.01); *G06F 11/1048* (2013.01); *G11C 29/52* (2013.01); *G11C 2029/0411* (2013.01)

(58) Field of Classification Search
CPC ....................................................... H04L 1/24
See application file for complete search history.

(56) References Cited

U.S. PATENT DOCUMENTS 3,571,794 A 3/1971 Tong
3,982,226 A 9/1976 Bunker et al.
(Continued)

FOREIGN PATENT DOCUMENTS

CN 102263607 A 11/2011
CN 103065683 A 4/2013
(Continued)

OTHER PUBLICATIONS

Communication dated Oct. 13, 2020 issued by the State Intellectual Property Office of P.R. China in Chinese Application No. 201610396687.4.

*Primary Examiner* — Joseph D Torres
(74) *Attorney, Agent, or Firm* — Sughrue Mion, PLLC

(57) ABSTRACT

A method of operating a semiconductor memory device can include receiving data, from a memory controller, at an Error Correction Code (ECC) engine included in the semiconductor memory device, the data including at least one predetermined error. Predetermined parity can be received at the ECC engine, where the predetermined parity is configured to correspond to the data without the at least one predetermined error. A determination can be made whether a number of errors in the data is correctable by the ECC engine using the data including the at least one predetermined error and the predetermined parity.

7 Claims, 21 Drawing Sheets

Related U.S. Application Data continuation of application No. 15/194,102, filed on Jun. 27, 2016, now Pat. No. 10,044,475.

(51) Int. Cl.
  *G06F 11/10* (2006.01)
  *G11C 29/04* (2006.01)

(56) References Cited

U.S. PATENT DOCUMENTS

| | | | |
|---|---|---|---|
| 4,034,195 A | 7/1977 | Bates | |
| 4,223,382 A | 9/1980 | Thorsrud | |
| 4,298,981 A | 11/1981 | Byford | |
| 4,371,949 A | 2/1983 | Chu et al. | |
| 4,397,022 A | 8/1983 | Weng et al. | |
| 4,476,562 A | 10/1984 | Sako et al. | |
| 4,531,213 A | 7/1985 | Scheuneman | |
| 4,688,207 A | 8/1987 | Yoshimoto | |
| 5,255,272 A | 10/1993 | Gill et al. | |
| 5,291,496 A | 3/1994 | Andaleon et al. | |
| 5,414,719 A | 5/1995 | Iwaki et al. | |
| 5,485,322 A | 1/1996 | Chainer et al. | |
| 5,502,732 A * | 3/1996 | Arroyo | G06F 11/2215 714/703 |
| 5,504,758 A | 4/1996 | Inoue et al. | |
| 5,589,994 A | 12/1996 | Yamasaki et al. | |
| 5,600,787 A | 2/1997 | Underwood et al. | |
| 5,812,556 A | 9/1998 | Schmidt | |
| 5,925,144 A | 7/1999 | Sebaa | |
| 6,061,826 A | 5/2000 | Thirumoorthy et al. | |
| 6,178,537 B1 | 1/2001 | Roohparvar | |
| 6,223,309 B1 | 4/2001 | Dixon et al. | |
| 6,295,617 B1 | 9/2001 | Sonobe | |
| 6,374,381 B1 | 4/2002 | Moriya | |
| 6,389,503 B1 | 5/2002 | Georgis et al. | |
| 6,397,357 B1 * | 5/2002 | Cooper | G06F 11/1052 714/703 |
| 6,405,322 B1 | 6/2002 | Gaither et al. | |
| 6,434,106 B1 | 8/2002 | Ohtsuka | |
| 6,557,126 B1 | 4/2003 | Kelly | |
| 6,754,871 B1 | 6/2004 | Pines et al. | |
| 6,799,287 B1 | 9/2004 | Sharma et al. | |
| 7,020,811 B2 | 3/2006 | Byrd | |
| 7,840,874 B2 | 11/2010 | Jacob | |
| 7,996,745 B2 | 8/2011 | Griseta et al. | |
| 8,281,219 B2 | 10/2012 | Parris et al. | |
| 8,423,836 B2 | 4/2013 | Sautter et al. | |
| 8,627,163 B2 | 1/2014 | Io et al. | |
| 8,694,862 B2 | 4/2014 | Sazeides et al. | |
| 8,848,465 B2 | 9/2014 | Kim et al. | |
| 8,924,815 B2 | 12/2014 | Frayer et al. | |
| 9,417,957 B2 | 8/2016 | Kho et al. | |
| 2002/0157044 A1 * | 10/2002 | Byrd | H04L 1/0057 714/703 |
| 2003/0106014 A1 | 6/2003 | Dohmen et al. | |
| 2004/0153902 A1 | 8/2004 | Machado et al. | |
| 2004/0225932 A1 | 11/2004 | Hoda et al. | |
| 2007/0177473 A1 | 8/2007 | Bae et al. | |
| 2007/0226597 A1 | 9/2007 | Taito et al. | |
| 2008/0168335 A1 | 7/2008 | Mead | |
| 2009/0187808 A1 | 7/2009 | Nichols | |
| 2009/0193315 A1 * | 7/2009 | Gower | H03M 13/09 714/758 |
| 2011/0087932 A1 | 4/2011 | Sautter et al. | |
| 2011/0145676 A1 | 6/2011 | Nicholson | |
| 2011/0154152 A1 | 6/2011 | Brzezinski | |
| 2012/0266051 A1 | 10/2012 | Farhoodfar et al. | |
| 2013/0104003 A1 | 4/2013 | Cho | |
| 2014/0136927 A1 | 5/2014 | Li et al. | |
| 2014/0164878 A1 | 6/2014 | Tam | |
| 2014/0250340 A1 * | 9/2014 | Cordero | G06F 11/1048 714/703 |
| 2015/0178147 A1 | 6/2015 | Cordero et al. | |

FOREIGN PATENT DOCUMENTS

| | | |
|---|---|---|
| CN | 103329103 A | 9/2013 |
| CN | 103389922 A | 11/2013 |
| CN | 104081358 A | 10/2014 |
| CN | 104575616 A | 4/2015 |

\* cited by examiner

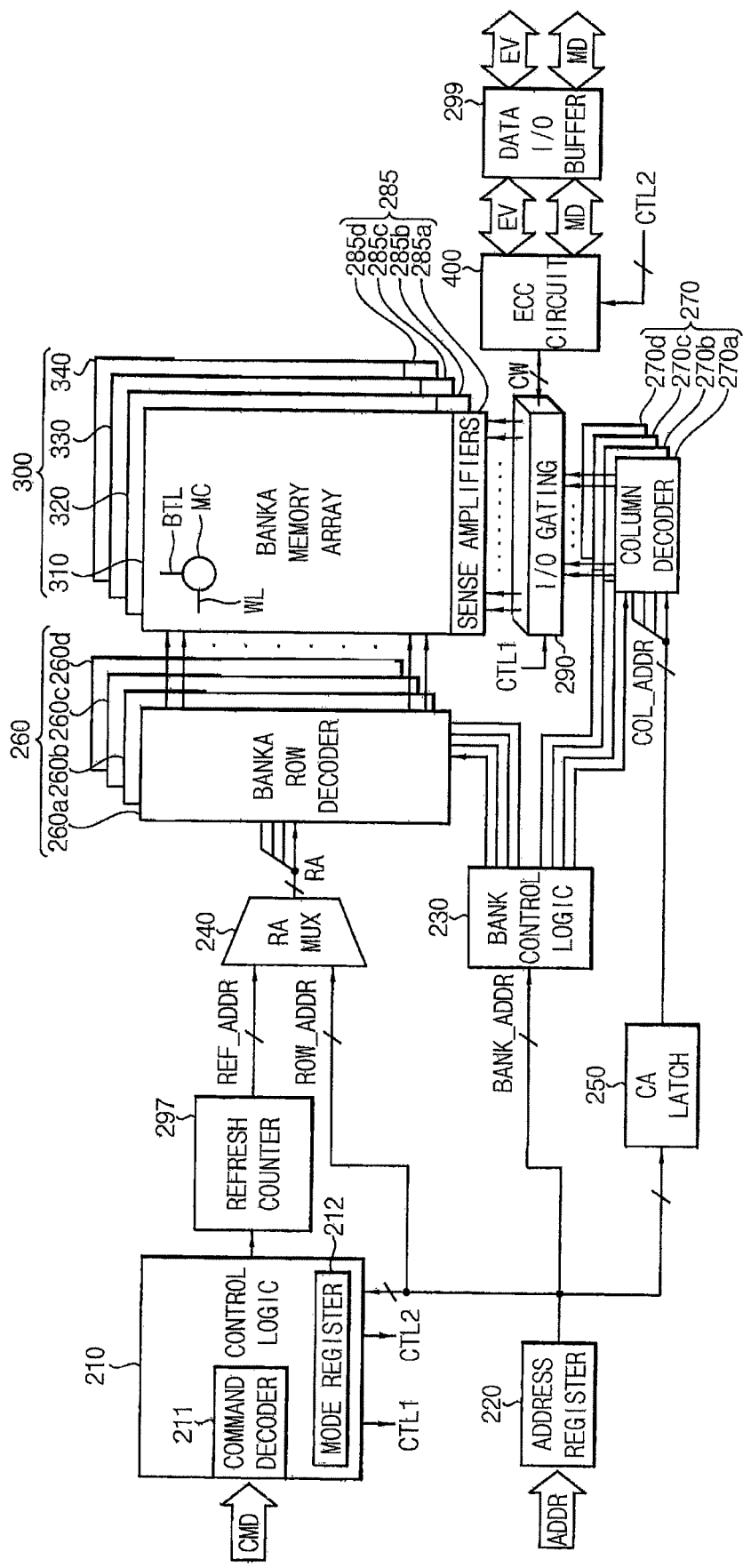

FIG. 11
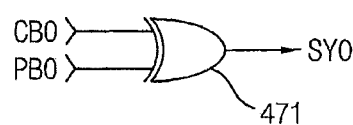
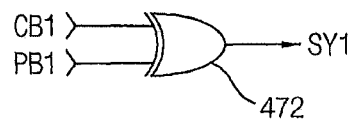
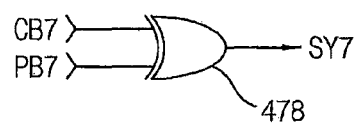
FIG. 12
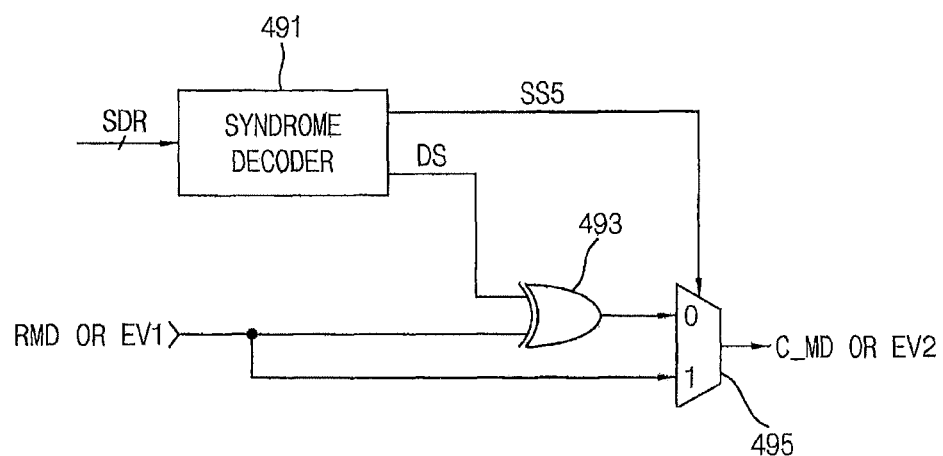

|  | BL0 | BL1 | BL2 | BL3 | BL4 | BL5 | BL6 | BL7 |
|---|---|---|---|---|---|---|---|---|
| DQ[0] | 1 | 0 | 0 | 0 | 0 | 0 | 0 | 0 |
| DQ[1] | 0 | 0 | 0 | 0 | 0 | 0 | 0 | 0 |
| DQ[2] | 0 | 0 CHK1 0 | | 0 | 0 | 0 CHK3 0 | | 0 |
| DQ[3] | 0 | 0 | 0 | 0 | 0 | 0 | 0 | 0 |
| DQ[4] | 0 | 0 | 0 | 0 | 0 | 0 | 0 | 0 |
| DQ[5] | 0 | 0 | 0 | 0 | 0 | 0 | 0 | 0 |
| DQ[6] | 0 | 0 CHK2 0 | | 0 | 0 | 0 CHK4 0 | | 0 |
| DQ[7] | 0 | 0 | 0 | 0 | 0 | 0 | 0 | 0 |
|  | \_\_\_\_SCW1\_\_\_\_ | | | | \_\_\_\_SCW2\_\_\_\_ | | | |

1 : ERROR BIT

|  | BL0 | BL1 | BL2 | BL3 | BL4 | BL5 | BL6 | BL7 |
|---|---|---|---|---|---|---|---|---|
| DQ[0] | 0 | 0 | 0 | 0 | 0 | 0 | 0 | 0 |
| DQ[1] | 0 | 0 | 0 | 0 | 0 | 0 | 0 | 0 |
| DQ[2] | 0 | 0 CHK1 0 | | 0 | 0 | 0 CHK3 0 | | 0 |
| DQ[3] | 0 | 0 | 0 | 0 | 0 | 0 | 0 | 0 |
| DQ[4] | 0 | 0 | 0 | 0 | 0 | 0 | 0 | 0 |
| DQ[5] | 0 | 0 | 0 | 0 | 0 | 0 | 0 | 0 |
| DQ[6] | 0 | 0 CHK2 0 | | 0 | 0 | 0 CHK4 0 | | 0 |
| DQ[7] | 0 | 0 | 0 | 0 | 0 | 0 | 0 | 0 |
|  | \_\_\_\_SCW1\_\_\_\_ | | | | \_\_\_\_SCW2\_\_\_\_ | | | |

| | BL0 | BL1 | BL2 | BL3 | BL4 | BL5 | BL6 | BL7 | |
|---|---|---|---|---|---|---|---|---|---|
| DQ[0] | 1 | 0 | 0 | 0 | 0 | 0 | 0 | 0 | |
| DQ[1] | 0 | 0 | 0 | 0 | 0 | 0 | 0 | 0 | |
| DQ[2] | 0 | 0 CHK1 0 | | 0 | 0 | 0 CHK3 0 | | 0 | |
| DQ[3] | 0 | 0 | 0 | 0 | 0 | 0 | 0 | 0 | 1:ERROR BIT |
| DQ[4] | 1 | 0 | 0 | 0 | 0 | 0 | 0 | 0 | |
| DQ[5] | 0 | 0 | 0 | 0 | 0 | 0 | 0 | 0 | |
| DQ[6] | 0 | 0 CHK2 0 | | 0 | 0 | 0 CHK4 0 | | 0 | |
| DQ[7] | 0 | 0 | 0 | 0 | 0 | 0 | 0 | 0 | |
| | ⎵ SCW1 ⎵ | | | | ⎵ SCW2 ⎵ | | | | |

| | BL0 | BL1 | BL2 | BL3 | BL4 | BL5 | BL6 | BL7 | |
|---|---|---|---|---|---|---|---|---|---|
| DQ[0] | 1 | 0 | 0 | 0 | 0 | 0 | 0 | 0 | |
| DQ[1] | 0 | 0 | 0 | 0 | 0 | 0 | 0 | 0 | |
| DQ[2] | 0 | 0 CHK1 0 | | 0 | 0 | 0 CHK3 0 | | 0 | |
| DQ[3] | 0 | 0 | 0 | 0 | 0 | 0 | 0 | 0 | 1:ERROR BIT |
| DQ[4] | 1 | 0 | 0 | 0 | 1 | 0 | 0 | 0 | |
| DQ[5] | 0 | 0 | 0 | 0 | 0 | 0 | 0 | 0 | |
| DQ[6] | 0 | 0 CHK2 0 | | 0 | 0 | 0 CHK4 0 | | 0 | |
| DQ[7] | 0 | 0 | 0 | 0 | 0 | 0 | 0 | 0 | |
| | ⎵ SCW1 ⎵ | | | | ⎵ SCW2 ⎵ | | | | |

| | BL0 | BL1 | BL2 | BL3 | BL4 | BL5 | BL6 | BL7 | |
|---|---|---|---|---|---|---|---|---|---|
| DQ[0] | 1 | 0 | 0 | 0 | 0 | 0 | 0 | 0 | |
| DQ[1] | 0 | 0 | 0 | 0 | 0 | 0 | 0 | 0 | |
| DQ[2] | 1 | 0 CHK1 0 | | 0 | 0 | 0 CHK3 0 | | 0 | |
| DQ[3] | 0 | 0 | 0 | 0 | 0 | 0 | 0 | 0 | 1:ERROR BIT |
| DQ[4] | 0 | 0 | 0 | 0 | 0 | 0 | 0 | 0 | |
| DQ[5] | 0 | 0 | 0 | 0 | 0 | 0 | 0 | 0 | |
| DQ[6] | 0 | 0 CHK2 0 | | 0 | 0 | 0 CHK4 0 | | 0 | |
| DQ[7] | 0 | 0 | 0 | 0 | 0 | 0 | 0 | 0 | |
| | \_\_\_\_SCW1\_\_\_\_ | | | | \_\_\_\_SCW2\_\_\_\_ | | | | |

| | BL0 | BL1 | BL2 | BL3 | BL4 | BL5 | BL6 | BL7 | |
|---|---|---|---|---|---|---|---|---|---|
| DQ[0] | 1 | 0 | 0 | 0 | 0 | 0 | 0 | 0 | |
| DQ[1] | 0 | 0 | 0 | 0 | 0 | 0 | 0 | 0 | |
| DQ[2] | 1 | 0 CHK1 0 | | 0 | 0 | 0 CHK3 0 | | 0 | |
| DQ[3] | 0 | 0 | 0 | 0 | 0 | 0 | 0 | 0 | 1:ERROR BIT |
| DQ[4] | 0 | 0 | 0 | 0 | 1 | 0 | 0 | 0 | |
| DQ[5] | 0 | 0 | 0 | 0 | 0 | 0 | 0 | 0 | |
| DQ[6] | 0 | 0 CHK2 0 | | 0 | 0 | 0 CHK4 0 | | 0 | |
| DQ[7] | 0 | 0 | 0 | 0 | 0 | 0 | 0 | 0 | |
| | \_\_\_\_SCW1\_\_\_\_ | | | | \_\_\_\_SCW2\_\_\_\_ | | | | |

CHARACTERIZATION OF IN-CHIP ERROR CORRECTION CIRCUITS AND RELATED SEMICONDUCTOR MEMORY DEVICES/MEMORY SYSTEMS

CROSS-REFERENCE TO RELATED APPLICATIONS

This is a continuation of U.S. patent application Ser. No. 16/032,544 filed on Jul. 11, 2018, which is a continuation of U.S. patent application Ser. No. 15/194,102 filed on Jun. 27, 2016 (now U.S. Pat. No. 10,044,475) and claims the benefit of priority under 35 USC § 119 to Korean Patent Application No. 10-2015-0091943, filed on Jun. 29, 2015, in the Korean Intellectual Property Office, the contents of which are incorporated herein in their entirety by reference.

FIELD

The present disclosure relates to error correction circuits of semiconductor memory devices, semiconductor memory devices including the same and memory systems.

BACKGROUND

Semiconductor memory devices may be classified into non-volatile memory devices, such as flash memory devices, and volatile memory devices such as DRAMs. High speed operation and cost of DRAMs make it possible for DRAMs to be used for system memory. Memory errors can increase when the scale of a memory drive is reduced.

SUMMARY

Embodiments according to the inventive concept can provide characterization of in-chip error correction circuits and related semiconductor memory devices/memory systems. Pursuant to these embodiments, a method of operating a semiconductor memory device can include receiving data, from a memory controller, at an Error Correction Code (ECC) engine included in the semiconductor memory device, the data including at least one predetermined error. Predetermined parity can be received at the ECC engine, where the predetermined parity is configured to correspond to the data without the at least one predetermined error. A determination can be made whether a number of errors in the data is correctable by the ECC engine using the data including the at least one predetermined error and the predetermined parity.

In some embodiments according to the inventive concept, an error correction circuit using an error correction code (ECC) in a semiconductor memory device can include a first register that can be configured to store a first error vector including at least one predetermined error bit in a code validation mode. An ECC engine can be configured to receive the first error vector and configured to perform ECC decoding on the first error vector based on predetermined reset parity data and configured to generate syndrome data in the code validation mode. A data corrector circuit can be configured to selectively correct the at least one predetermined error bit in the first error vector based on the syndrome data and configured to output a second error vector indicating a capability of the ECC.

In some embodiments according to the inventive concept, a semiconductor memory can include a memory cell array and an error correction circuit that can be configured to perform an error correction code (ECC) decoding based on data read from the memory cell array in a normal mode. A control logic circuit can be configured to control access to the memory cell array and configured to control the error correction circuit in response to a command from an external device, where the error correction circuit can be configured to perform the ECC decoding on a first error vector and configured to output a second error vector indicating a result of the ECC decoding when the command directs a code validation mode to test an ECC implemented in the error correction circuit and the first error vector provided from the external device includes at least one predetermined error bit.

In some embodiments according to the inventive concept, a memory system can include at least one semiconductor memory device and a memory controller that can be configured to control the at least one semiconductor memory device, wherein the at least one semiconductor memory device can include a memory cell array and an error correction circuit that can be configured to perform an error correction code (ECC) decoding based on data read from the memory cell array in a normal mode and a control logic circuit that can be configured to control access to the memory cell array and configured to control the error correction circuit in response to a command from the memory controller, where the error correction circuit can be configured to perform the ECC decoding on a first error vector from the memory controller and configured to output a second error vector indicating a result of the ECC decoding when the command directs a code validation mode to test an ECC implemented in the error correction circuit and the first error vector includes at least one predetermined error bit.

BRIEF DESCRIPTION OF THE DRAWINGS

FIG. 3 is a block diagram illustrating the semiconductor memory device shown in FIG. 2, according to example embodiments.

FIG. 11 illustrates the syndrome generator in the ECC engine shown in FIG. 10 according to example embodiments.

FIG. 12 illustrates the data corrector in the error correction circuit shown in FIG. 8 according to example embodiments.

FIG. 15A illustrates an example of the first error vector input to the error correction circuit.

FIG. 15B illustrates an example of the second error vector output from the error correction circuit respectively in the code validation mode.

FIG. 16A illustrates an example of the first error vector input to the error correction circuit.

FIG. 16B illustrates an example of the second error vector output from the error correction circuit respectively in the code validation mode.

FIG. 17A illustrates an example of the first error vector input to the error correction circuit.

FIG. 17B illustrates an example of the second error vector output from the error correction circuit respectively in the code validation mode.

DETAILED DESCRIPTION OF EMBODIMENTS ACCORDING TO THE INVENTIVE CONCEPT

Figure 1:
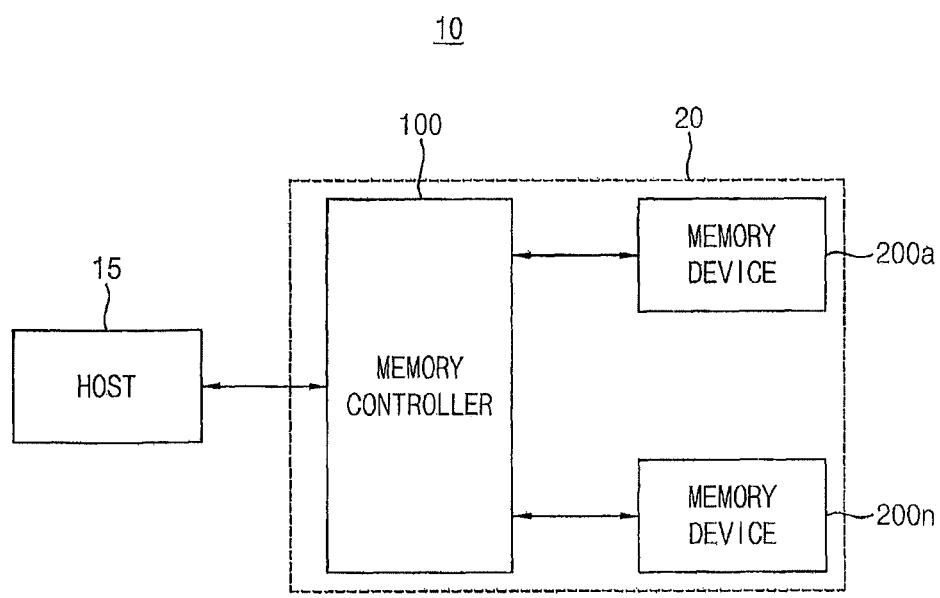
FIG. 1 is a block diagram illustrating an electronic system according to example embodiments.

The inventive concepts are described hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Development of fine feature semiconductor manufacturing technology has increased the memory capacity of a semiconductor memory device. Due to the increased capacity, the problem of defective and weak cells has also increased. The defective cells may not correctly store data due to a hardware defect. For example, the defective cells may be memory cells that do not operate correctly due to a defect generated during the manufacturing process, e.g., memory cells having a disconnect or "short". In contrast, weak cells are software-defective. That is, the weak cells are memory cells that are defective under a specific voltage condition or specific operation timing. Examples of weak cells include cells that deteriorate in terms of their characteristics, e.g., shortened refresh duration, degraded cell write performance or variable retention time, etc.

To provide a desired manufacturing yield, 'fail' memory cells can be repaired by replacing them with redundant memory cells which operate properly. However, a sufficient yield may not be achieved only using a redundancy repair operation because of increased number of defective memory cells. Especially, the number of single bit errors has increased to become a major obstacle in further enhancing the manufacturing yields. Thus, a method of repairing bits-in-error (error bits) by applying an error correction code (ECC) operation as well as a redundancy repair operation in dynamic random access memory (DRAM) is known.

The ECC operation provides an ECC function to detect and correct errors that occurred during writing/reading of data (or while data has been stored). To provide data integrity, the DRAM may employ an ECC circuit. For example, the ECC circuit may perform the ECC operation using a group of parity bits to detect and correct.

FIG. 1 is a block diagram illustrating an electronic system according to example embodiments.

Referring to FIG. 1, an electronic system 10 may include a host 15 and a memory system 20. The memory system 20 may include a memory controller 100 and a plurality of semiconductor memory devices 200a-200n (n is an integer greater than two).

The host 15 may communicate with the memory system 20 through various interface protocols such as Peripheral Component Interconnect-Express (PCI-E), Advanced Technology Attachment (ATA), Serial ATA (SATA), Parallel ATA (PATA), or serial attached SCSI (SAS). In addition, the host 15 may also communicate with the memory system 20 through interface protocols such as Universal Serial Bus (USB), Multi-Media Card (MMC), Enhanced Small Disk Interface (ESDI), or Integrated Drive Electronics (IDE).

The memory controller 100 may control an overall operation of the memory system 20. The memory controller 100 may control an overall data exchange between the host 15 and the plurality of semiconductor memory devices 200a-200n. For example, the memory controller 100 may write data in the plurality of semiconductor memory devices 200a-200n or read data from the plurality of semiconductor memory devices 200a-200n in response to a request from the host 20.

In addition, the memory controller 100 may issue commands to the plurality of semiconductor memory devices 200a-200n to control the plurality of semiconductor memory devices 200a-200n.

In some embodiments, each of the plurality of semiconductor memory devices 200a-200n may be a memory device including resistive type memory cells such as a magnetoresistive random access memory (MRAM), a resistive random access memory (RRAM), a phase change random access memory (PRAM) and a ferroelectric random access memory (FRAM), etc. In other example embodiments, each of the plurality of semiconductor memory devices 200a-200n may be a memory device including dynamic memory cells such as a dynamic random access memory (DRAM).

An MRAM is a nonvolatile memory based on magnetoresistance. An MRAM is different from a volatile RAM in many aspects. For example, since an MRAM is nonvolatile, the MRAM may retain all stored data even when power is turned off to the MRAM.

Although a nonvolatile RAM is generally slower than a volatile RAM, an MRAM has read and write response times comparable with read and write response times of a volatile RAM. Unlike a conventional RAM that stores data as electric charge, an MRAM stores data using magnetoresistance (or magnetoresistive) elements. In general, a magnetoresistance element is made of two magnetic layers, each having a magnetization.

An MRAM is a nonvolatile memory device that reads and writes data by using a magnetic tunnel junction pattern including two magnetic layers and an insulating film disposed between the two magnetic layers. A resistance value of the magnetic tunnel junction pattern may vary according to a magnetization direction of each of the magnetic layers. The MRAM may program or remove data by using the variation of the resistance value.

An MRAM using a spin transfer torque (STT) phenomenon uses a method in which when a spin-polarized current flows in one direction, a magnetization direction of the magnetic layer is changed due to the spin transfer of electrons. A magnetization direction of one magnetic layer (e.g., a pinned layer) may be fixed and a magnetization direction of the other magnetic layer (e.g., a free layer) may vary according to a magnetic field generated by a program current.

The magnetic field of the program current may arrange the magnetization directions of the two magnetic layers in parallel or in anti-parallel. In at least one example embodiment, if the magnetization directions of the two magnetic layers are parallel, a resistance between the two magnetic layers is in a low ("0") state. If the magnetization directions of the two magnetic layers are anti-parallel, a resistance between the two magnetic layers is in a high ("1") state. Switching of the magnetization direction of the free layer and the high or low state of the resistance between the two magnetic layers result in write and read operations of the MRAM.

Although the MRAM is nonvolatile and provides a quick response time, an MRAM cell has a limited scale and is sensitive to write disturbance because the program current applied to switch the high and low states of the resistance between the magnetic layers of the MRAM is typically high. Accordingly, when a plurality of cells are arranged in an MRAM array, a program current applied to one memory cell may change a magnetic field of a free layer of an adjacent cell (e.g., a write disturbance). Such a write disturbance may be mitigated (or alternatively, prevented) by using an STT phenomenon. A typical STT-MRAM may include a magnetic tunnel junction (MTJ), which is a magnetoresistive data storage device including two magnetic layers (e.g., a pinned layer and a free layer) and an insulating layer disposed between the two magnetic layers.

A program current typically flows through the MTJ. The pinned layer spin-polarizes electrons of the program current, and a torque is generated as the spin-polarized electron current passes through the MTJ. The spin-polarized electron current applies the torque to the free layer while interacting with the free layer. When the torque of the spin-polarized electron current passing through the MTJ is greater than a threshold switching current density, the torque applied by the spin-polarized electron current is sufficient to switch a magnetization direction of the free layer. Accordingly, the magnetization direction of the free layer may be parallel or anti-parallel to the pinned layer and a resistance state in the MTJ is changed.

The STT-MRAM removes a requirement of an external magnetic field for the spin-polarized electron current to switch the free layer in the magnetoresistive device. In addition, the STT-MRAM improves scaling as a cell size is reduced and the program current is reduced to mitigate (or alternatively, prevent) the write disturbance. In addition, the STT-MRAM may have a high tunnel magnetoresistance ratio, which improves a read operation in a magnetic domain by allowing a high ratio between the high and low states.

An MRAM is an all-round memory device that is low cost and has high capacity (like a dynamic random access memory (DRAM), operates at high speed (like a static random access memory (SRAM), and is nonvolatile (like a flash memory).

Figure 2:
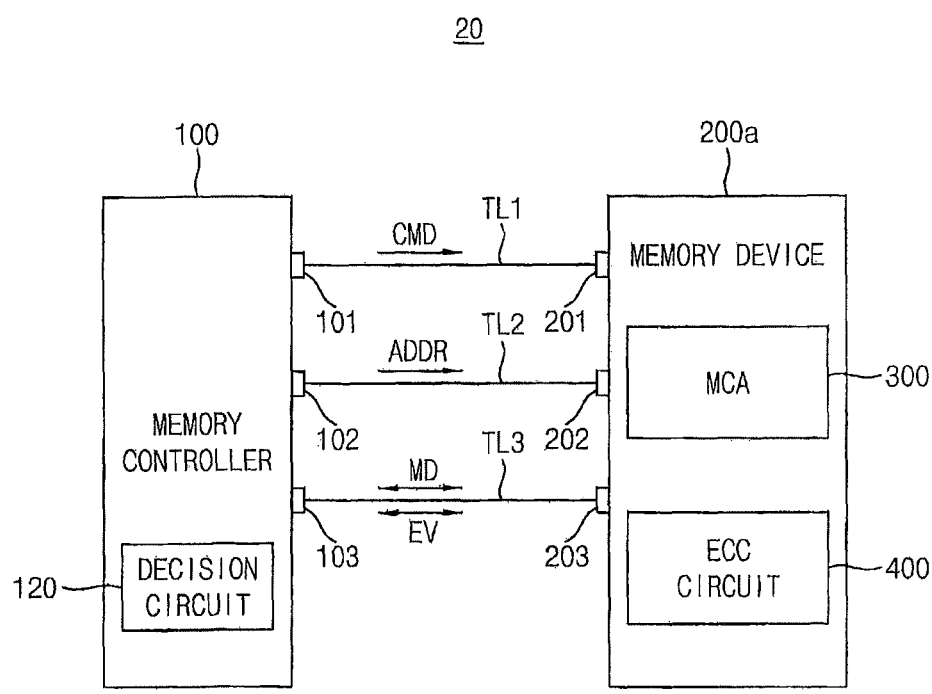
FIG. 2 is a block diagram illustrating the memory system shown in FIG. 1, according to example embodiments.

FIG. 2 is a block diagram illustrating the memory system shown in FIG. 1.

In FIG. 2, only one semiconductor memory device 200a in communication with the memory controller 100 is illustrated for convenience. However, the details discussed herein related to semiconductor memory device 200a may equally apply to the other semiconductor memory devices 200b-200n.

Referring to FIG. 2, the memory system 20 may include the memory controller 100 and the semiconductor memory device 200a. Each of the memory controller 100 and the semiconductor memory device 200a may be formed as a separate semiconductor chip or as a separate group of chips (e.g., the memory controller 100 and the semiconductor memory device 200a may be packaged together). The memory controller 100 and the semiconductor memory device 200a may be connected to each other through corresponding command pins 101 and 201, corresponding address pins 102 and 202, and corresponding data pins 103 and 203. The command pins 101 and 201 may transmit a command signal CMD via a command transmission line TL1, the address pins 102 and 202 may transmit an address signal ADDR via an address transmission line TL2, and the data pins 103 and 203 may exchange main data MD in a normal mode or may exchange an error vector EV including at least one error bit in a code validation mode through a data transmission line TL3.

The semiconductor memory device 200a may include a memory cell array (MCA) 300 that stores the main data MD and an error correction circuit 400. The memory controller 100 may include a decision circuit 120 that determines a characteristic of an error correction code (ECC) implemented in the error correction circuit 400 based on the error vector EV. The error correction circuit 400 may perform ECC encoding and ECC decoding on the main data MD in the normal mode and may perform an ECC decoding on the error vector EV based on reset parity data stored therein in the code validation mode.

FIG. 3 is a block diagram illustrating the semiconductor memory device shown in FIG. 2, according to example embodiments.

Referring to FIG. 3, the semiconductor memory device 200a may include a control logic (or a control logic circuit) 210, an address register 220, a bank control logic 230, a refresh counter 297, a row address multiplexer 240, a column address latch 250, a row decoder 260, a column decoder 270, a memory cell array 300, a sense amplifier unit 285, an input/output (I/O) gating circuit 290, the error correction circuit 400, and a data input/output (I/O) buffer 299.

The memory cell array 300 may include first through fourth bank arrays 310-340. The row decoder 260 may include first through fourth bank row decoders 260a-260d respectively coupled to the first through fourth bank arrays 310-340, the column decoder 270 may include first through fourth bank column decoders 270a-270d respectively coupled to the first through fourth bank arrays 310-340, and the sense amplifier unit 285 may include first through fourth bank sense amplifiers 285a-280d respectively coupled to the first through fourth bank arrays 310-340. Each of the first through fourth bank arrays 310-340 may include a plurality of memory cells MC, and each of memory cells MC is coupled to a corresponding word-line WL and a corresponding bit-line BTL. The first through fourth bank arrays 310-340, the first through fourth bank row decoders 260a-260d, the first through fourth bank column decoders 270a-270d and first through fourth bank sense amplifiers 285a-280d may form first through fourth banks. Although the semiconductor memory device 200a shown in FIG. 3 illustrates four banks, the semiconductor memory device 200a may include fewer or greater number of banks.

The address register 220 may receive an address ADDR including a bank address BANK_ADDR, a row address ROW_ADDR and a column address COL_ADDR from the memory controller 100. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through fourth bank row decoders 260a-260d corresponding to the bank address BANK_ADDR may be activated in response to the bank control signals, and one of the first through fourth bank column decoders 270a-270d corresponding to the bank address BANK_ADDR may be activated in response to the bank control signals.

The refresh counter 297 may be included when the semiconductor memory device 200a is a DRAM. The refresh counter 297 may generate a refresh row address REF_ADDR for refreshing memory cell rows in the memory cell array 300 under control of the control logic 210. The refresh counter 297 may be absent when the semiconductor memory device 200a is an MRAM or another technology which does not require refresh operations.

The row address multiplexer 240 may receive the row address ROW_ADDR from the address register 220, and may receive the refresh row address REF_ADDR from the refresh counter 297. The row address multiplexer 240 may selectively output the row address ROW_ADDR or the refresh row address REF_ADDR as a row address RA. The row address RA that is output from the row address multiplexer 240 may be applied to the first through fourth bank row decoders 260a-260d.

The activated one of the first through fourth bank row decoders 260a-260d may decode the row address RA that is output from the row address multiplexer 240, and may activate a word-line corresponding to the row address RA. For example, the activated bank row decoder may apply a word-line driving voltage to the word-line corresponding to the row address RA.

The column address latch 250 may receive the column address COL_ADDR from the address register 220, and may temporarily store the received column address COL_ADDR. In some embodiments, in a burst mode, the column address latch 250 may generate column addresses that increment starting from the received column address COL_ADDR. The column address latch 250 may apply the temporarily stored or generated column address to the first through fourth bank column decoders 270a-270d.

The activated one of the first through fourth bank column decoders 270a-270d may decode the column address COL_ADDR that is output from the column address latch 250, and may control the I/O gating circuit 290 in order to output data corresponding to the column address COL_ADDR.

The I/O gating circuit 290 may include circuitry for gating input/output data. The I/O gating circuit 290 may further include read data latches for storing data that is output from the first through fourth bank arrays 310-340, and write drivers for writing data to the first through fourth bank arrays 310-340.

Codeword CW read from one bank array of the first through fourth bank arrays 310-340 may be sensed by sense amplifiers coupled to the one bank array from which the data is to be read, and may be stored in the read data latches. The codeword CW stored in the read data latches may be provided to the memory controller 100 via the error correction circuit 400 and the data I/O buffer 299. Main data MD to be written in one bank array of the first through fourth bank arrays 310-340 may be provided to the data I/O buffer 299 from the memory controller 100. The main data MD provided to the data I/O buffer 299 is encoded to provide the codeword CW from the error correction circuit 400. The write driver may write the codeword CW in a selected bank array of the first through fourth bank arrays 310-340.

The data I/O buffer 299 receives the error vector EV from the memory controller 100 in the code validation mode, provides the error vector EV to the error correction circuit 400. The data I/O buffer 299 provides the error correction circuit 400 with the main data MD from the memory controller 100 in a write operation of the normal mode, and provides the main data MD from the error correction circuit 400 to the memory controller 100 in a read operation of the normal mode. In some embodiments according to the inventive concept, the error vector EV can be generated inside the memory device under control of the memory controller 100.

The error correction circuit 400, in the code validation mode to verify an ECC implemented therein, performs the ECC decoding the error vector EV and may provide the memory controller 100 through the data I/O buffer 299 with the error vector EV indicating a result of the ECC decoding.

The error correction circuit 400, in a write operation of the normal mode, may generate parity data based on the main data MD from the data I/O buffer 299, and may provide the I/O gating circuit 290 with the codeword CW including the main data MD and the parity data. The I/O gating circuit 290 may write the codeword CW to a target page of the memory cell array 300. In addition, the error correction circuit 400, in a read operation of the normal mode, may receive the codeword CW, read from the target page of the memory cell array 300, from the I/O gating circuit 290. The error correction circuit 400 may perform an ECC decoding on the main data MD based on the parity data in the codeword CW, may correct a single bit error in the main data MD and may provide corrected main data to the data I/O buffer 299.

The control logic 210 may control operations of the semiconductor memory device 200a. For example, the control logic 210 may generate control signals for the semiconductor memory device 200a in order to perform a write operation or a read operation. The control logic 210 may include a command decoder 211 that decodes a command CMD received from the memory controller 100 and a mode register 212 that sets an operational mode of the semiconductor memory device 200a.

For example, the command decoder 211 may generate the control signals corresponding to the command CMD by decoding a write enable signal (/WE), a row address strobe signal (/RAS), a column address strobe signal (/CAS), a chip select signal (/CS), etc. The control logic 210 may generate a first control signal CTL1 to control the I/O gating circuit 290 and a second control signal CTL2 to control the error correction circuit 400 by decoding the command CMD.

FIGS. 4A to 4E are circuit diagrams of examples of the memory cell shown in FIG. 3, according to example embodiments.

Figure 4A:
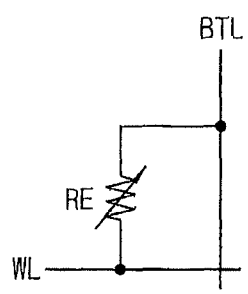
FIGS. 4A to 4E are circuit diagrams of examples of the memory cells shown in FIG. 3, according to example embodiments.
Figure 4B:
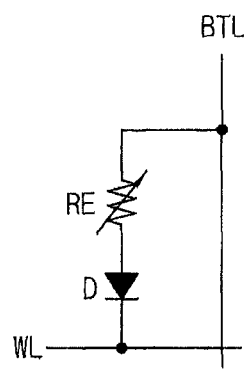
Figure 4C:
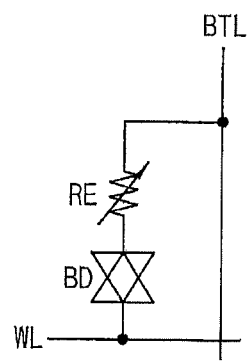
Figure 4D:
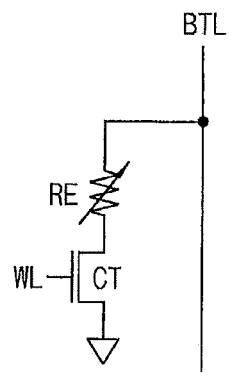
Figure 4E:
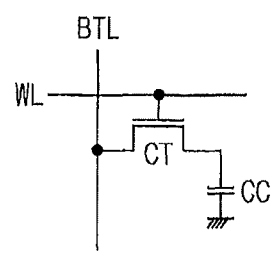

FIGS. 4A to 4D illustrate memory cells MC which are implemented with resistive type memory cells and FIG. 4E illustrates a memory cell MC which is implemented with a dynamic memory cell.

FIG. 4A illustrates a resistive type memory cell without a selection element, while FIGS. 4B to 4D show resistive type memory cells each comprising a selection element.

Referring to FIG. 4A, a memory cell MC may include a resistive element RE connected to a bit-line BTL and a word-line WL. Such a resistive memory cell having a structure without a selection element may store data by a voltage applied between bit-line BL and word-line WL.

Referring to FIG. 4B, a memory cell MC may include a resistive element RE and a diode D. The resistive element RE may include a resistive material for data storage. The diode D may be a selection element (or switching element) that supplies current to resistive element RE or cuts off the current supply to resistive element RE according to a bias of word-line WL and bit-line BTL. The diode D may be coupled between the resistive element RE and word-line WL, and the resistive element RE may be coupled between the bit-line BTL and the diode D. Positions of the diode D and the resistive element RE may be interchangeable. The diode D may be turned on or turned off by a word-line voltage. Thus, a resistive memory cell may be not driven where a voltage of a constant level or higher is supplied to an unselected word-line WL.

Referring to FIG. 4C, a memory cell MC may include a resistive element RE and a bidirectional diode BD. The resistive element R may include a resistive material for data storage. The bidirectional diode BD may be coupled between the resistive element RE and a word-line WL, and the resistive element RE may be coupled between a bit-line BTL and bidirectional diode BD. Positions of the bidirectional diode BD and the resistive element RE may be interchangeable. The bidirectional diode BD may block leakage current flowing to an unselected semiconductor memory cell.

Referring to FIG. 4D, a memory cell MC may include a resistive element RE and a transistor CT. The transistor CT may be a selection element (or switching element) that supplies current to the resistive element RE or cuts off the current supply to the resistive element RE according to a voltage of a word-line WL. The transistor CT may be coupled between the resistive element RE and a word-line WL, and the resistive element RE may be coupled between a bit-line BTL and the transistor CT. Positions of the transistor CT and the resistive element RE may be interchangeable. The semiconductor memory cell may be selected or unselected depending on whether the transistor CT driver by word-line WL is turned on or turned off.

Referring to FIG. 4E, a memory cell MC may include a cell capacitor CC and a transistor CT. The transistor CT may be a selection element (or switching element) that connects/disconnects the cell capacitor CC to/from bit-line BTL according to a voltage of a word-line WL. The transistor CT may be coupled between the cell capacitor CC, a word-line WL and a bit-line BTL, and the cell capacitor CC may be coupled between the transistor CT and a plate voltage.

Figure 5:
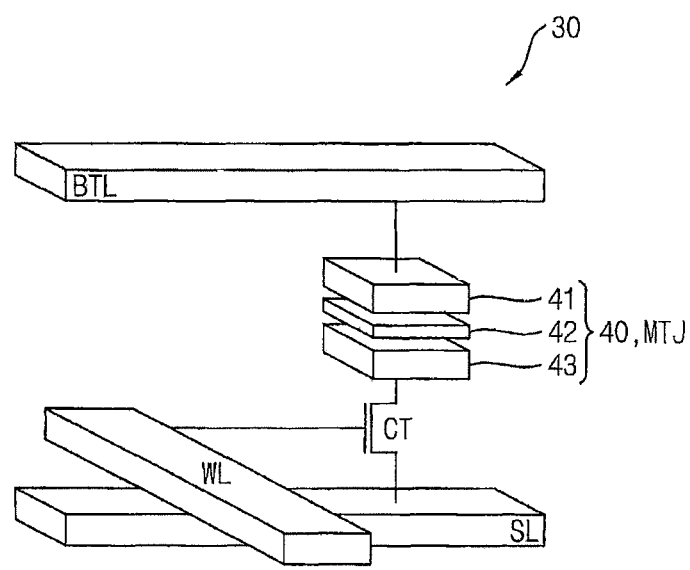
FIG. 5 illustrates an example of the memory cells shown in FIG. 3, according to example embodiments.

FIG. 5 illustrates an example of the memory cell (referred to as STT-MRAM cell) shown in FIG. 3, according to example embodiments.

Referring to FIG. 5, an STT-MRAM cell 30 may include a MTJ element 40 and a cell transistor CT. A gate of the cell transistor CT is connected to a word-line WL and one electrode of the cell transistor CT is connected through the MTJ 40 to a bit-line BTL. Also, the other electrode of the cell transistor CT is connected to a source line SL.

The MTJ element 40 may include the free layer 41, the pinned layer 43, and a tunnel layer 42 disposed between the free layer 41 and the pinned layer 43. A magnetization direction of the pinned layer 43 may be fixed, and a magnetization direction of the free layer 41 may be parallel to or anti-parallel to the magnetization direction of the pinned layer 43 according to written data. In order to fix the magnetization direction of the pinned layer 43, for example, an anti-ferromagnetic layer may be further provided.

In order to perform a write operation of the STT-MRAM cell 30, a logic high voltage is applied to the word-line WL to turn on the cell transistor CT. A program current, for example, a write current is applied to the bit-line BL and the source line SL. A direction of the write current is determined by a logic state of the MTJ element 40.

In order to perform a read operation of the STT-MRAM cell 30, a logic high voltage is applied to the word-line WL to turn on the cell transistor CT, and a read current is supplied to the bit-line BL and the source line SL. Accordingly, a voltage is developed at both ends of the MTJ element 40, is detected by the sense amplifier 285a, and is compared with a reference voltage to determine a logic state of the MTJ element 40. Accordingly, data stored in the MTJ element 40 may be detected.

Figure 6A:
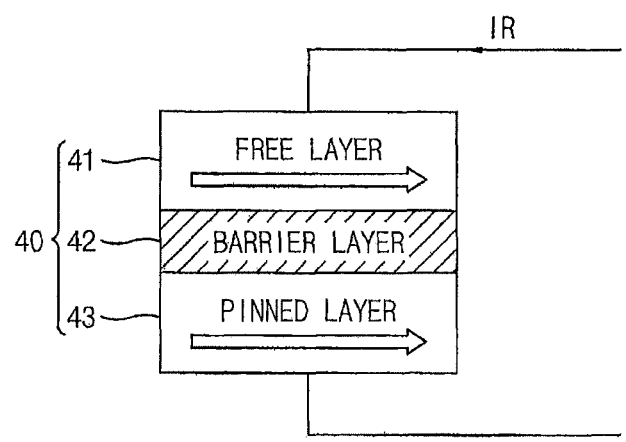
FIGS. 6A and 6B illustrate a magnetization direction according to data written to the MTJ element shown in FIG. 5.
Figure 6B:
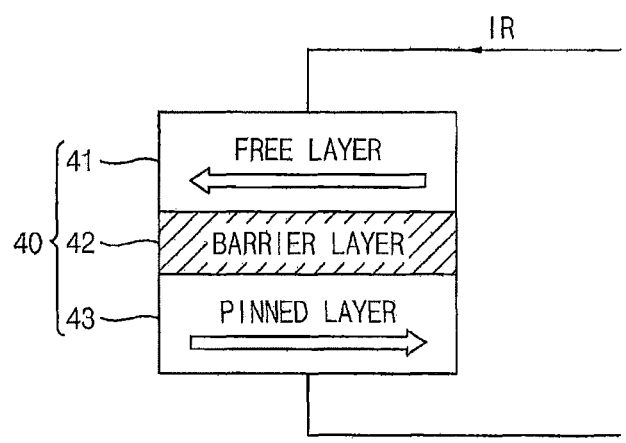

FIGS. 6A and 6B illustrate a magnetization direction according to data written to the MTJ element shown in FIG. 5.

A resistance value of the MTJ element 40 may vary according to a magnetization direction of the free layer 41. When a read current IR flows through the MTJ 40, a data voltage is output according to the resistance value of the MTJ element 40. Since the read current IR is much smaller than a write current, a magnetization direction of the free layer 41 is not changed by the read current IR.

Referring to FIG. 6A, a magnetization direction of the free layer 41 and a magnetization direction of the pinned layer 43 of the MTJ element 40 are parallel. Accordingly, the MTJ element 40 may have a low resistance value. In this case, the MTJ element 40 may read data '0'.

Referring to FIG. 6B, a magnetization direction of the free layer 41 and a magnetization direction of the pinned layer 43 of the MTJ element 40 are anti-parallel. Accordingly, the MTJ element 40 may have a high resistance value. In this case, the MTJ element 40 may read data '1'.

Although the free layer 41 and the pinned layer 43 of the MTJ element 40 are horizontal magnetic layers, example embodiments are not limited thereto and the free layer 41 and the pinned layer 43 may be, for example, vertical magnetic layers.

Figure 7:
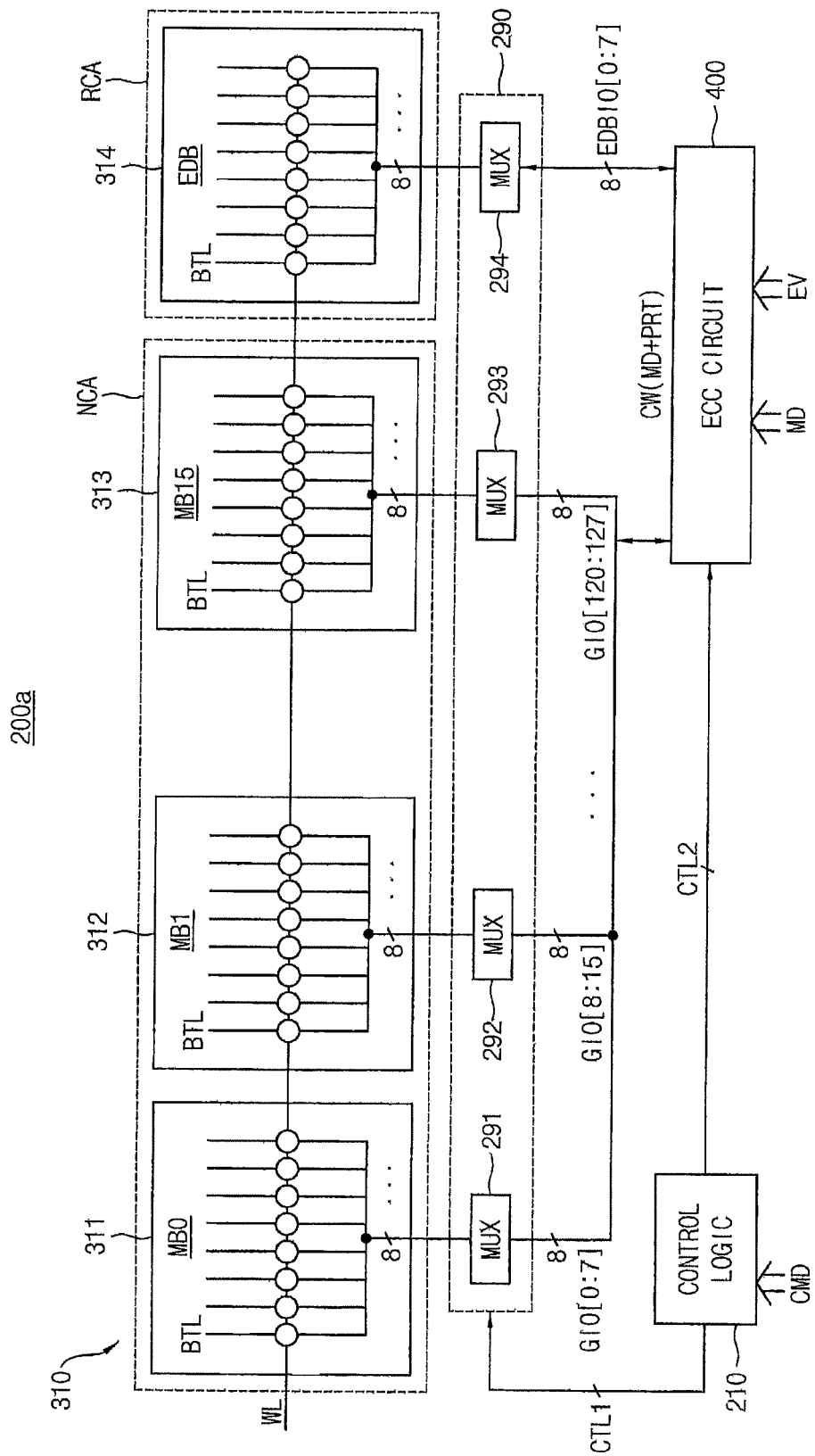
FIG. 7 illustrates a portion of the semiconductor memory device of FIG. 3 according to example embodiments.

FIG. 7 illustrates a portion of the semiconductor memory device of FIG. 3 according to example embodiments.

In FIG. 7, the control logic 210, the first bank array 310, the I/O gating circuit 290, and the error correction circuit 400 are illustrated.

Referring to FIG. 7, the first bank array 310 may include a normal cell array NCA and a redundancy cell array RCA. The normal cell array NCA may include a plurality of first memory blocks MB0-MB15, i.e., 311-313, and the redundancy cell array RCA may include at least a second memory block 314. The first memory blocks 311-313 are memory blocks determining a memory capacity of the semiconductor memory device 200a. The second memory block 314 is for ECC and/or redundancy repair. Since the second memory block 314 for ECC and/or redundancy repair is used for ECC, data line repair and block repair to repair 'fail' cells located in the first memory blocks 311-313, the second memory block is also referred to as an EDB block.

In each of the first memory blocks 311-313, a plurality of first memory cells are arrayed in rows and columns. In the second memory block 314, a plurality of second memory cells are arrayed in rows and columns.

In the first memory blocks 311-313, rows may be formed, for example, of 8K word-lines WL and columns may be formed, for example, of 1K bit-lines BTL. Memory cells connected to intersections of the word-lines WL and the bit-lines BTL may be dynamic memory cells or resistive type memory cells.

The I/O gating circuit 290 includes a plurality of switching circuit 291-294 respectively connected to the first memory blocks 311-313 and the second memory block 314. In the semiconductor memory device 200a, bit lines corresponding to data of a burst length (BL) may be simultaneously accessed to support the BL indicating the maximum number of column positions that is accessible. For example, if the BL is set to 8, data bits may be set to 128 bits.

The error correction circuit 400 is connected to the switching circuit 291-294 through corresponding first data lines GIO[0:127] and second data lines EDBIO[0:7]. The error correction circuit 400, in a write operation of the normal mode, performs an ECC encoding on the main data MD to generate parity data PRT (which together provide a correction of 136 bits), and stores the codeword CW including the main data MD and the parity data PRT in the first memory blocks 311,312 and 313 and the second memory block 314 via the switching circuits 291-294.

The error correction circuit 400, in a read operation of the normal mode, receives the codeword CW stored in the first memory blocks 311,312 and 313 and the second memory block 314 via the switching circuits 291-294 and performs an ECC decoding on the main data MD. In some embodiments, the ECC is configured to detect and correct a single bit error found within the codeword CW during the read operation. Accordingly, the ECC circuit 400 can correct the identified single bit error and pass the main data position of the codeword to the memory container. In addition, the error correction circuit 400, in a code validation mode, stores the error vector EV, performs an ECC decoding on the error vector EV based on reset parity data stored therein and outputs the error vector EV indicating a result of the ECC decoding.

The control logic 210 provides the first control signal CTL1 to the switching circuits 291-294 and the second control signal CTL2 to the error correction circuit 400 by decoding the command CMD.

The switching circuits 291-293 connect the first memory blocks 311-313 to the first data lines GIO[0:127] and the switching circuit 294 connects the second memory block 314 to the second data lines EDBIO[0:7] in response to the first control signal CTL1 in a normal mode. The error correction circuit 400 performs an ECC decoding in response to the second control signal CTL2 in a normal mode.

The switching circuits 291-293 disconnect the first memory blocks 311-313 from the first data lines GIO[0:127] and the switching circuit 294 disconnects the second memory block 314 from the second data lines EDBIO[0:7] in response to the first control signal CTL1 in a code validation mode.

The error correction circuit 400, in a code validation mode, stores the error vector EV, performs an ECC decoding on the error vector EV based on reset parity data stored therein and outputs the error vector EV indicating a result of the ECC decoding.

Figure 8:
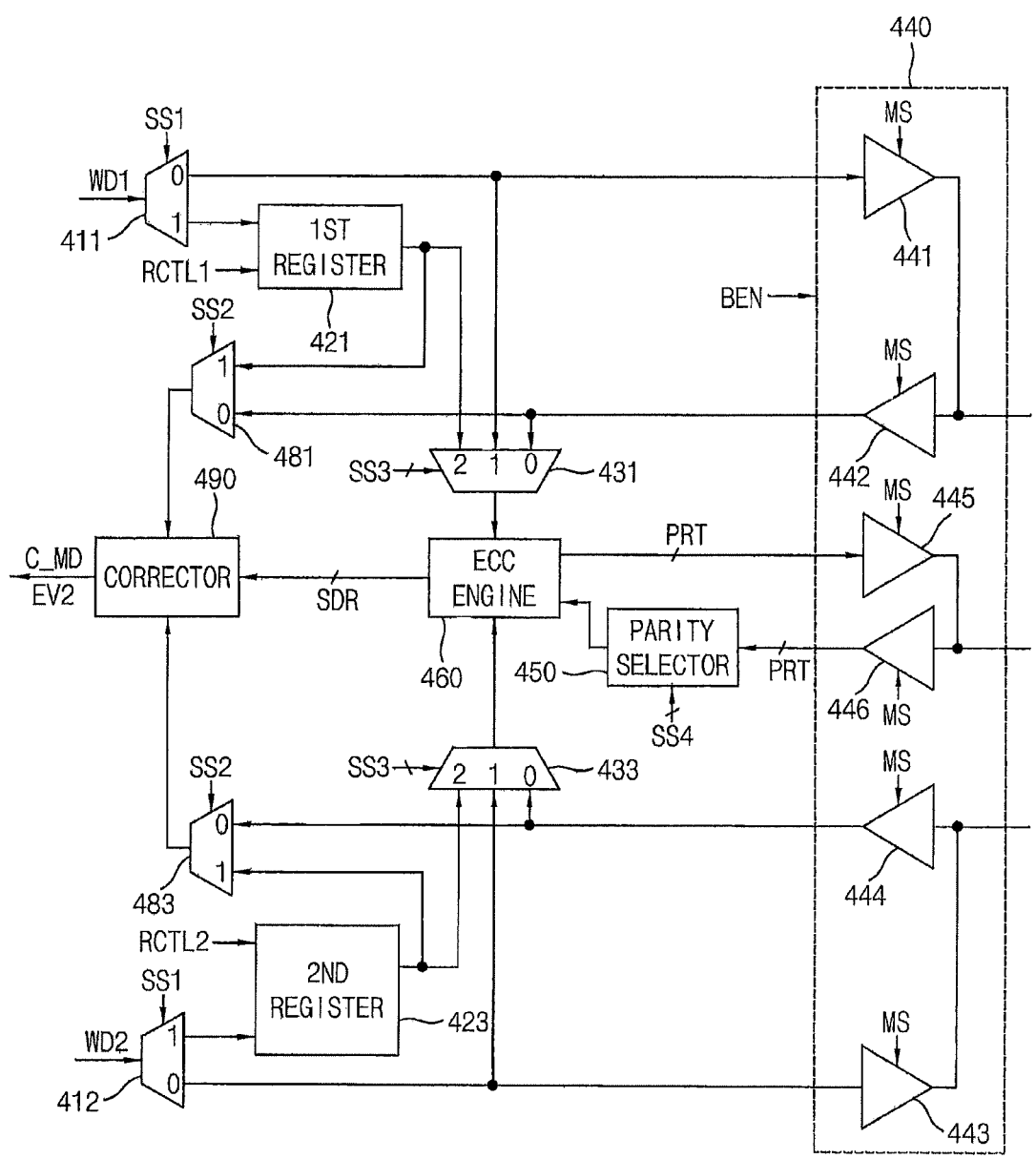
FIG. 8 illustrates the error correction circuit shown in FIG. 3 according to example embodiments.

FIG. 8 illustrates the error correction circuit shown in FIG. 3 according to example embodiments.

Referring to FIG. 8, the error correction circuit 400 may include demultiplexers 411 and 412, a first register 421, a second register 423, multiplexers 431 and 433, a buffer unit 440, a parity selector 450, an ECC engine 460, multiplexers 481 and 483 and a data corrector 490.

The demultiplexers 411 and 412 may constitute a first selection circuit, the multiplexers 431 and 433 may constitute a second selection circuit and the multiplexers 481 and 483 may constitute a third selection circuit. The buffer unit 440 may include buffers 441-446.

The demultiplexer 411 may provide a first write data WD1 to the buffer 441 and to the multiplexer 431 or provide the first write data WD1 to the first register 421 in response to a selection signal SS1. The first write data WD1 may be a first portion of the main data MD in a normal mode and may be a first error vector or a portion of the first error vector in a code validation mode. The demultiplexer 412 may provide a second write data WD2 to the buffer 443 and to the multiplexer 443 or provide the second write data WD2 to the second register 423 in response to the selection signal SS1. The second write data WD2 may be a second portion of the main data MD in a normal mode and may be a portion of the first error vector in a code validation mode.

The first register 421 may store the first error vector or a portion of the first error vector from the demultiplexer 411 in a write operation of the code validation mode. The first register 421 may provide the first error vector or the portion of the first error vector to the multiplexer 431 in response to a register control signal RCTL1 in a read operation of the code validation mode. The second register 423 may provide the multiplexer 433 with the portion of the first error vector from the demultiplexer 412 or reset data stored therein in response to a register control signal RCTL2 in a read operation of the code validation mode.

In a write operation of the semiconductor memory device 200a, unit of prefetched data is smaller than a unit of the codeword CW. In this case, the second register 423 may provide the multiplexer 433 with the portion of the first error vector from the demultiplexer 412 or the reset data stored therein in response to a register control signal RCTL2.

The multiplexer 431, in a write operation of the normal mode, provides the ECC engine 460 with the first write data WD1 from the demultiplexer 411 in response to a selection signal SS3. The multiplexer 431, in a read operation of the normal mode, provides the ECC engine 460 with read codeword from the buffer 442 in response to the selection signal SS3. The multiplexer 431, in the code validation mode, provides the ECC engine 460 with the first error vector or the portion of the first error vector from the first register 421 in response to the selection signal SS3.

The multiplexer 433, in a write operation of the normal mode, provides the ECC engine 460 with the second write data WD2 from the demultiplexer 411 in response to the selection signal SS3. The multiplexer 433, in a read operation of the normal mode, provides the ECC engine 460 with the read codeword from the buffer 444 in response to the selection signal SS3. The multiplexer 433, in the code validation mode, provides the ECC engine 460 with the portion of the first error vector or the reset data from the second register 423 in response to the selection signal SS3.

The buffer unit 440 may be selectively enabled in response to a buffer enable signal BEN. The buffer unit 440 may be enabled in response to the buffer enable signal BEN in a normal mode and may be disabled in the code validation mode in response to the buffer enable signal BEN. The buffers 441 and 443 may be enabled in the write operation of the normal mode in response to a mode signal MS and provide the write data WD to the I/O gating circuit 290. The buffers 442 and 444 may be enabled in the read operation of the normal mode in response to the mode signal MS and provide the read data from the I/O gating circuit 290 to the multiplexers 481 and 483. The buffer 445 may be enabled in the write operation of the normal mode in response to the mode signal MS and provide the parity data PRT from the second memory block 314 to the parity selector 450.

The parity selector 450 may provide the parity data PRT from the buffer 446 to the ECC engine 460 in the normal mode and may provide the ECC engine 460 with the reset parity data generated therein (by the parity selector 450) in the code validation mode.

The ECC engine 460, in the write operation of the normal mode, may perform an ECC encoding on the write data WD to provide the parity data PRT to the buffer 445. The ECC engine 460, in the read operation of the normal mode, may perform an ECC decoding on the read data from the multiplexers 431 and 433 based on the parity data PRT from the parity selector 450 to provide syndrome data SDR to the data corrector 490. The ECC engine 460, in the code validation mode, may perform an ECC decoding on the first error vector based on the reset parity data from the parity selector 450 to provide the syndrome data SDR to the data corrector 490.

The multiplexer 481 provides the read data to the data corrector 490 in the read operation of the normal mode and provides the data corrector 490 with the first error vector or the portion of the first error vector from the first register 421 in the code validation mode in response to a selection signal SS2. The multiplexer 483 provides the data corrector 490 with the portion of the first error vector or the reset data from the second register 423 in the code validation mode in response to the selection signal SS2.

The data corrector 490, in the normal mode, corrects an error in the read data based on the syndrome data SDR from the ECC engine 460 to provide corrected main data C_MD. The data corrector 490, in the code validation mode, corrects or does not correct errors in the read data based on the syndrome data SDR from the ECC engine 460 to provide a second error vector EV2.

In FIG. 8, the selection signals SS1-SS4, the buffer control signals RCTL1 and RCTL2, the buffer enable signal BEN and the mode signal MS may be included in the second control signal CTL from the control logic 210 in FIG. 7.

The code validation mode is a mode for verifying a characteristic of the ECC implemented in the ECC engine 460. The characteristic of the ECC implemented in the ECC engine 460 may be various according to manufactures of the semiconductor memory device 200a. According to example embodiments, in the code validation mode, a first error vector including at least one error bit is written in the first register 421, the ECC engine 460 performs an ECC decoding on the first error vector to generate the syndrome data SDR, and the data corrector 460 outputs the second error vector EV2 with or without correcting the at least one error bit in the first error vector depending on the number of errors in the first error vector. The memory controller 100 may determine the characteristic of the ECC implemented in the ECC engine 460 based on the second error vector EV2.

For example, it is assumed that the first error vector includes a first error bit and a second error bit (i.e. 2 bits in error) when the ECC implemented in the ECC engine 460 may correct a single bit error. When the second error vector EV2 may further include a third error bit generated by the ECC decoding, the memory controller 100 may determine the characteristic of the ECC implemented in the ECC engine 460 based on a position of the third error bit.

Figure 9:
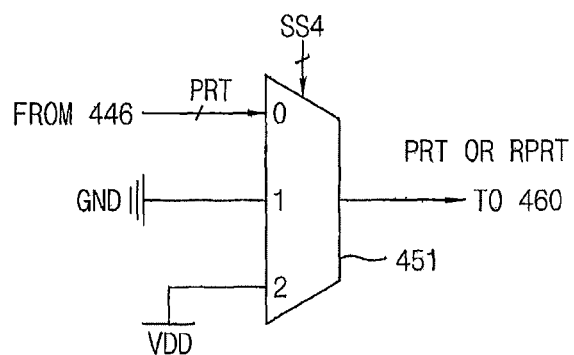
FIG. 9 illustrates the parity selector in the error correction circuit shown in FIG. 8 according to example embodiments.

FIG. 9 illustrates the parity selector in the error correction circuit shown in FIG. 8 according to example embodiments.

Referring to FIG. 9, the parity selector 450 includes a multiplexer 451.

The multiplexer 451 includes a first input receiving the parity data PRT from the buffer 446, a second input connected to a ground voltage GND and a third input connected to a power supply voltage VDD. The parity selector 450 provides the ECC engine 460 with the parity data PRT from the buffer 446 in the read operation of the normal mode and provides the ECC engine 460 with the reset parity data with a first logic level or a second logic level in the code validation mode, in response to the selection signal SS4. The reset parity data RPRT may have a logic level different from the at least one error bit in the error vector.

Figure 10:
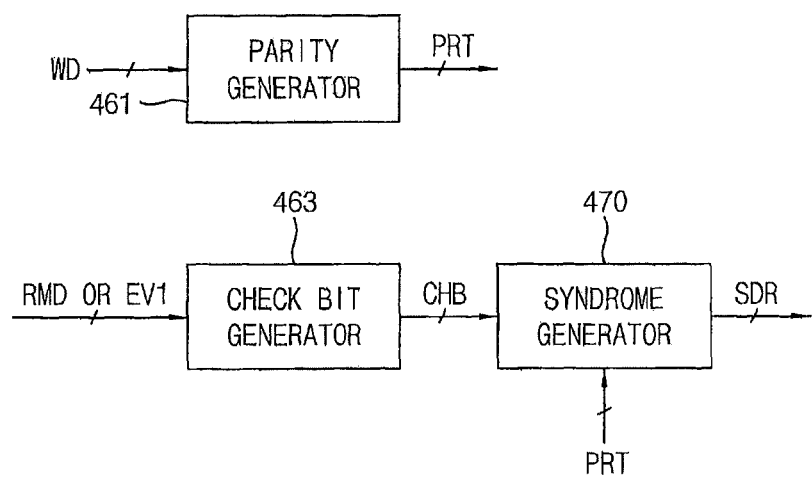
FIG. 10 illustrates the error correction code (ECC) engine in the error correction circuit shown in FIG. 8 according to example embodiments.

FIG. 10 illustrates the ECC engine in the error correction circuit shown in FIG. 8 according to example embodiments.

Referring to FIG. 10, the ECC engine 460 may include a parity generator 461, a check bit generator 463, and a syndrome generator 470.

The parity generator 461 may generate the parity data PRT based on the write data WD using an array of exclusive OR gates.

The check bit generator 463 may generate check bits CHB based on the read main data RMD in the normal mode and may generate the check bits CHB based on the first error vector EV1. The syndrome generator 470 may generate the syndrome data SDR based on the check bits CHB based on the first error vector EV1 and the reset parity data RPRT from the parity selector 450 in the code validation mode.

FIG. 11 illustrates the syndrome generator in the ECC engine shown in FIG. 10 according to example embodiments.

In FIG. 11, it is assumed that the check bits CHB include 8 bits CB0-CB7 and the syndrome data SDR includes 8 bits SY0-SY7.

Referring to FIG. 11, the syndrome generator 470 may include a plurality of exclusive OR gates 471-478. Each of the exclusive OR gates 471-478 may perform an exclusive OR operation on corresponding one of the check bits CB0-CB7 and corresponding one of the parity bits PB0-PB7 to generate corresponding one of syndromes SY0-SY7. Therefore, the syndrome generator 470 may generate the syndromes SY0-SY7, and each of the syndromes SY0-SY7 may have a logic level according to whether corresponding one of the check bits CB0-CB7 and corresponding one of the parity bits PB0-PB7 are same with respect to each other. When the check bit CB is different from the parity bit PB0, the corresponding syndrome SY0 may have a first logic level (logic high level). When the check bit CB is same as the parity bit PB0, the corresponding syndrome SY0 may have a second logic level (logic low level).

FIG. 12 illustrates the data corrector in the error correction circuit shown in FIG. 8 according to example embodiments.

Referring to FIG. 12, the data corrector 490 may include a syndrome decoder 491, a bit inverter 493 and a selection circuit 495 which is implemented by a multiplexer.

The syndrome decoder 491 may decode the syndrome data SDR to generate a decoding signal DS and a selection signal SS5. The decoding signal DS may indicate a position of the at least one error bit and the selection signal SS5 may have a logic level depending on a number of the at least one error bit.

The bit inverter 493 may invert the at least one error bit in response to the decoding signal DS. The selection circuit 495 may select one of the read main data RMD and an output of the bit inverter 493 to provide the corrected main data C_MD in response to the selection signal SS5 in the normal mode. The selection circuit 495 may select one of the first error vector EV1 and an output of the bit inverter 493 to provide the second error vector EV2 in response to the selection signal SS5 in the code validation mode.

The syndrome decoder 491 may output the selection signal SS5 with a first logic level when a number of the at least one error bit in the read main data RMD or the first error vector EV1 exceeds the error correction capability of the ECC based on the syndrome data SDR. The selection circuit 495 may provide the first error vector EV1 as the second error vector EV2 in response to the selection signal SS5 having a first logic level. The syndrome decoder 491 may output the selection signal SS5 with a second logic level when a number of the at least one error bit in the read main data RMD or the first error vector EV1 is within the error correction capability of the ECC based on the syndrome data SDR. The bit inverter 493 may invert the at least one error bit in response to the decoding signal DS having a first logic level.

Figure 13:
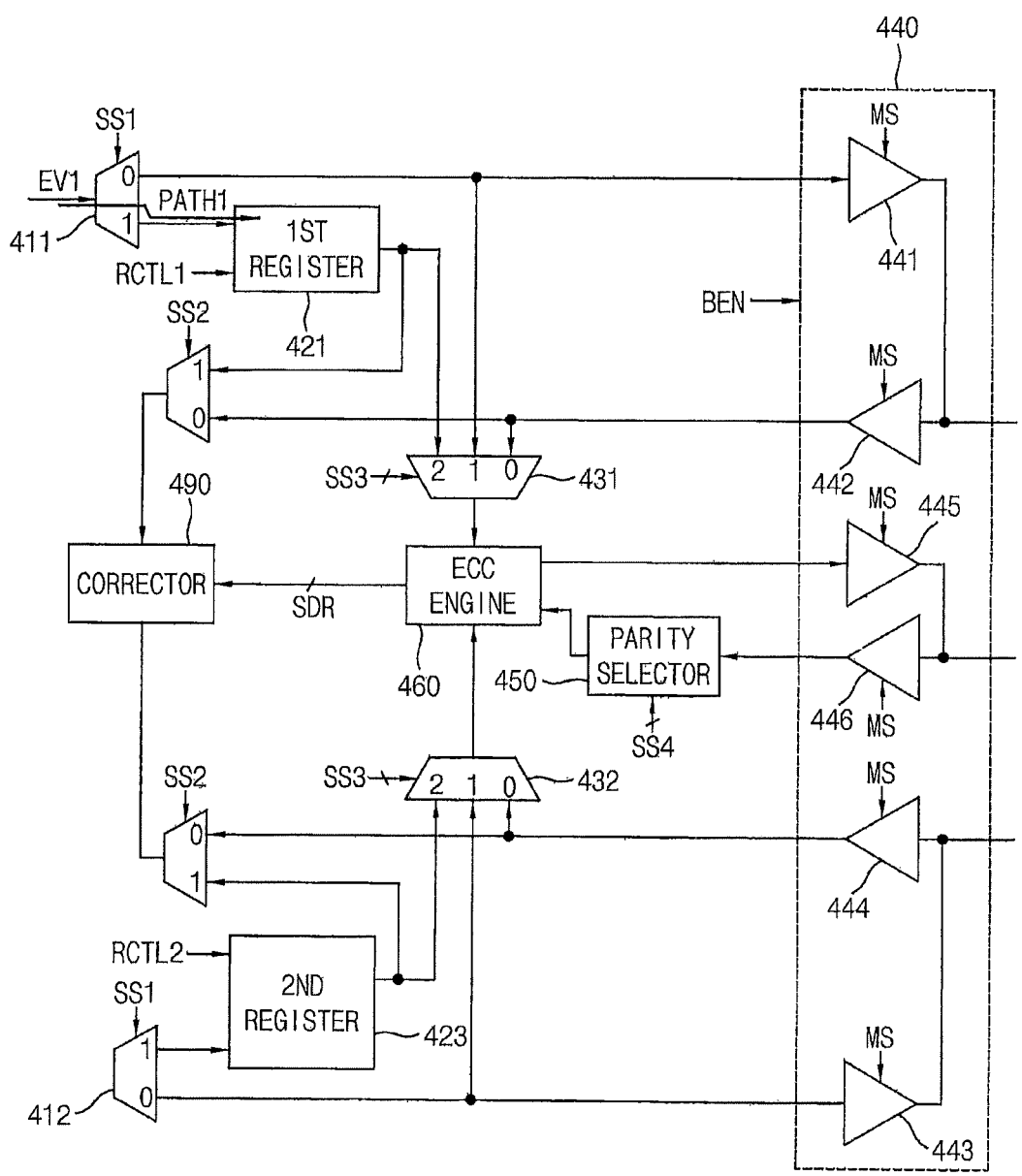
FIG. 13 illustrates the error correction circuit shown in FIG. 3 performing a write operation of the code validation mode.

FIG. 13 illustrates the error correction circuit shown in FIG. 3 in a write operation of the code validation mode.

Referring to FIG. 13, in a write operation of the code validation mode, the first error vector EV1 or the portion of the first error vector EV1 may be stored in the first register 421 through a first path PATH1. In this case, the selection signal SS1 may have a first logic level.

Figure 14:
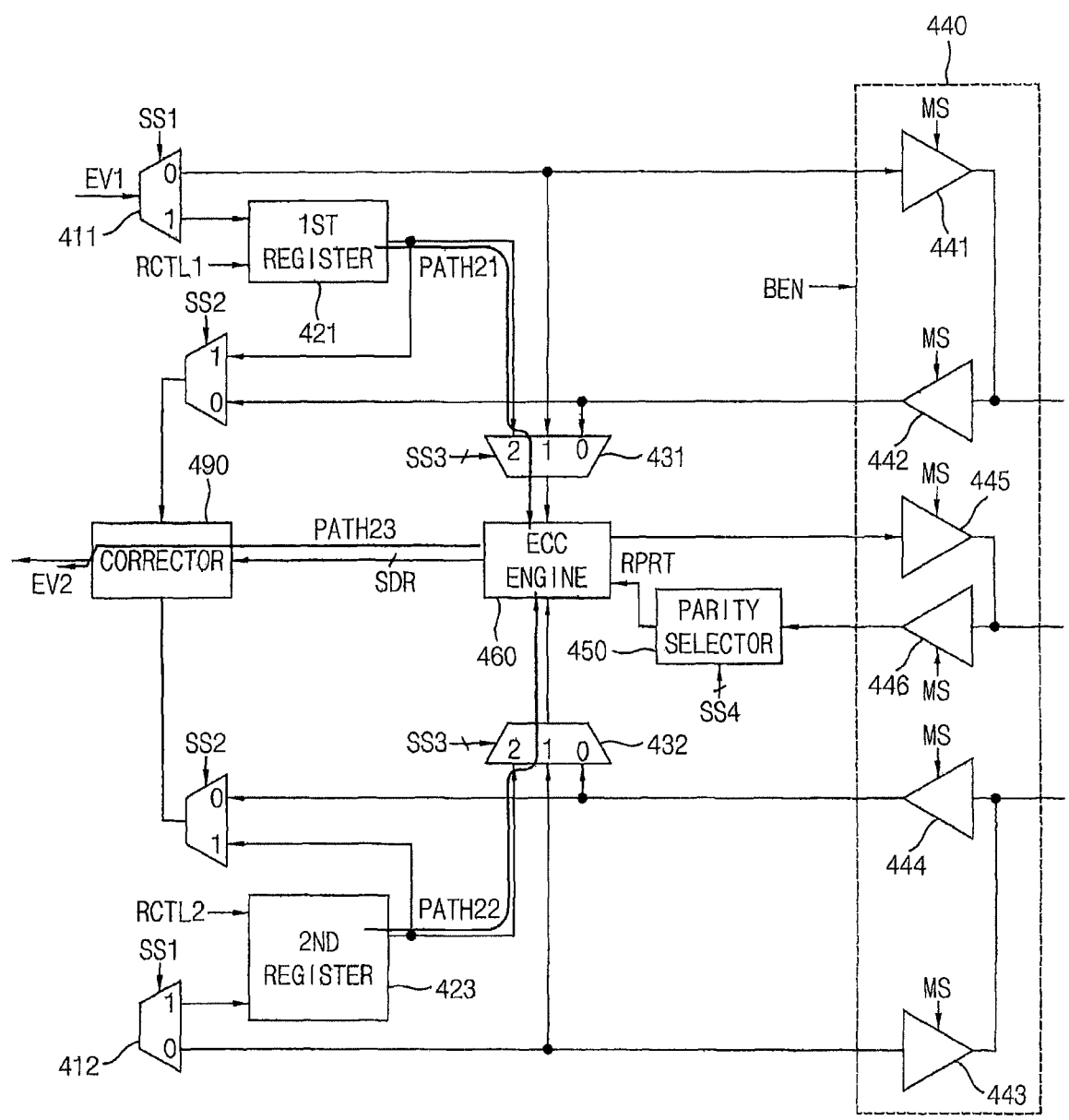
FIG. 14 illustrates the error correction circuit shown in FIG. 3 performing a read operation of the code validation mode.

FIG. 14 illustrates the error correction circuit shown in FIG. 3 in a read operation of the code validation mode assuming the operation shown in FIG. 13 has already been performed.

Referring to FIG. 14, in a write operation of the code validation mode, the first error vector EV1 or the portion of the first error vector EV1 stored in the first register 421 may be provided to the ECC engine 460 via a first path PATH21. When a size (or a unit) of the first error vector EV1 is smaller than the unit of the codeword CW, the reset data stored in the second register 423 may be also provided to the ECC engine 460 via a second path PATH22 in response to the register control signal RCTL2.

In addition, in the write operation of the code validation mode, the parity selector 450 may provide the ECC engine 460 with the reset parity data RPRT having a logic level different from a logic level of the at least one error bit in the first error vector EV1 in response to the selection signal SS4. The ECC engine 460 may generate the syndrome data SDR based on the reset parity data RPRT to provide the syndrome data SDR to the data corrector 490. The data corrector 490 may perform an ECC decoding on the first error vector EV1 based on the syndrome data SDR to output the second error vector EV2 indicating a result of the ECC decoding on the first error vector EV1. The ECC engine 460 and the data corrector 490 may output the second error vector EV2 via a third path PATH23.

The decision circuit 120 in the memory controller 100 may determine the characteristic of the ECC implemented in the ECC engine 460 based on positions and a number of the error bits in the second error vector EV2.

FIG. 15A illustrates an example of the first error vector input to the error correction circuit and FIG. 15B illustrates an example of the second error vector output from the error correction circuit respectively in the code validation mode.

In FIGS. 15A and 15B, each size of a first error vector EV11 and a second error vector EV12 corresponds to a size of a half codeword, and each of the first error vector EV11 and the second error vector EV12 may include a first sub codeword (or rank codeword) SCW1 and a second sub codeword SCW2 which are discriminated by burst lengths BL0-BL7 of the semiconductor memory device 200a. In addition, the first sub codeword SCW1 may include a first chunk CHK1 and a second chunk CHK2 which are discriminated by data input/output (I/O) pads DQ0-DQ7 of the semiconductor memory device 200a and the second sub codeword SCW2 may include a third chunk CHK3 and a fourth chunk CHK4. In addition, it is assumed that the error correction circuit 400 may generate 8-bit parity data PRT based on the 128-bit main data and may correct a single bit error in the main data MD.

Referring to FIGS. 15A and 15B, when the first error vector EV11 includes one error bit (i.e., a single bit in error) in the first chunk CHK1, the error correction circuit 400 corrects the error bit in the first error vector EV11 using 8-bit parity data PRT and may output the second error vector EV21 which does not include an error bit.

FIG. 16A illustrates an example of the first error vector input to the error correction circuit and FIG. 16B illustrates an example of the second error vector output from the error correction circuit respectively in the code validation mode.

Referring to FIGS. 16A and 16B, when the first error vector EV12 includes a first error bit in the first chunk CHK1 and a second error bit in the second chunk CHK2, the error correction circuit 400 does not correct the error bits in the first error vector EV12 and outputs the second error vector EV22 including an additional error bit (i.e., 3 bits in error), generated by the ECC decoding, in the fourth chunk CHK4. The additional error bit is generated in the fourth chunk CHK4 by mis-correction of the error correction circuit 400 because a number of error bits in the first error vector EV12 exceeds the error correction capability of the error correction circuit 400.

In this case, since the first sub codeword SCW1 includes two error bits in two different chunks, the decision circuit 120 in the memory controller 100 determines that the first sub codeword SCW1 is uncorrectable at a system level. In addition, since the second sub codeword SCW2 includes one error bit, the decision circuit 120 in the memory controller 100 determines that the second sub codeword SCW2 is correctable at a system level.

FIG. 17A illustrates an example of the first error vector input to the error correction circuit and FIG. 17B illustrates an example of the second error vector output from the error correction circuit respectively in the code validation mode.

Referring to FIGS. 17A and 17B, when the first error vector EV13 includes first and second error bits in the first chunk CHK1, the error correction circuit 400 does not correct the error bits in the first error vector EV13 and outputs the second error vector EV23 including an additional error bit, generated by the ECC decoding, in the fourth chunk CHK4. The additional error bit is generated in the fourth chunk CHK4 by mis-correction of the error correction circuit 400 because a number of error bits in the first error vector EV13 exceeds the error correction capability of the error correction circuit 400.

In this case, since the first sub codeword SCW1 includes two error bits in the same chunk, the decision circuit 120 in the memory controller 100 determines that the first sub codeword SCW1 is correctable at a system level. In addition, since the second sub codeword SCW2 includes one error bit, the decision circuit 120 in the memory controller 100 determines that the second sub codeword SCW2 is correctable at a system level.

For example, when one sub codeword includes an error bit, the memory controller 100 determines that the sub codeword is correctable at a system level. In addition, when one chunk includes error bits up to 16, the memory controller 100 determines that the sub codeword including that chunk is correctable at the system level.

For example, when one sub codeword includes two error bits in different two chunks, the memory controller 100 determines that the sub codeword is uncorrectable at a system level. In this case, the memory controller 100 may detect two error bits in one sub codeword but may not correct the two error bits.

For example, when one sub codeword includes three or more error bits in different chunks, the memory controller 100 may not detect the errors in the sub codeword. In this case, the memory controller 100 cannot counteract the errors.

According to example embodiments, a first error bit and a second error bit are intentionally (i.e., predetermined) inserted in the first error vector EV1 including the first sub codeword SCW1 and the second sub codeword SCW2. The error correction circuit 400 performs an ECC decoding on the first error vector EV1 including at least the first error bit and the second error bit based on the reset parity data RPRT generated in the ECC engine 460 instead of the parity data read from the memory cell array 300 to output the second error vector EV2. The decision circuit 120 in the memory controller 100 may determine the characteristic of the ECC implemented in the ECC engine 460 based on position of an addition error bit, i.e., a third error bit in the second error vector which indicates a result of the ECC decoding.

Figure 18:
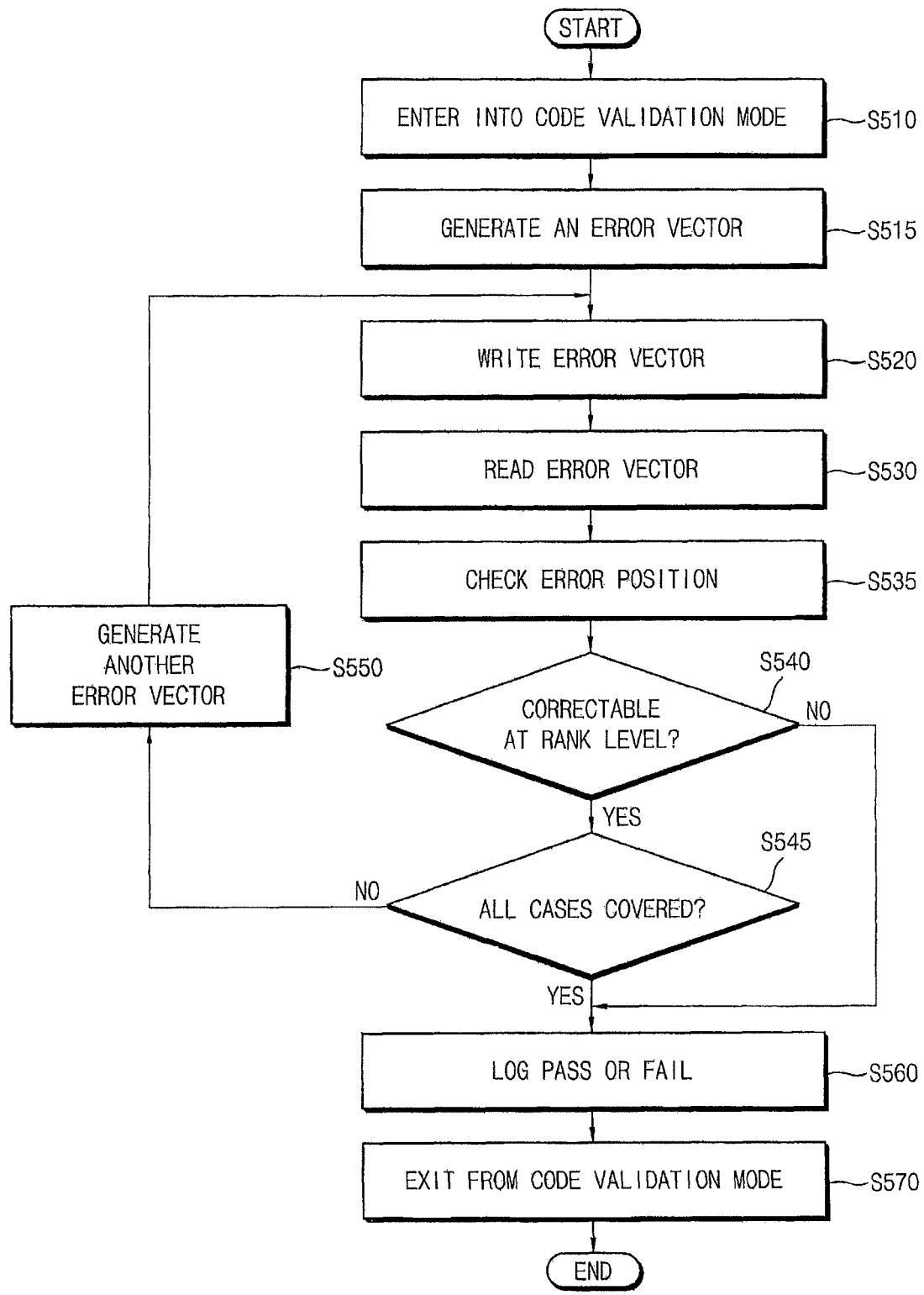
FIG. 18 is a flowchart illustrating a method of verifying an error correction code implemented in the semiconductor memory device according to example embodiments.

FIG. 18 is a flowchart illustrating a method of verifying an error correction code implemented in the semiconductor memory device according to example embodiments.

Referring to FIGS. 2 through 18, operation mode of the semiconductor memory device 200a enters into a code validation mode by writing a code validation mode in the mode register 212 in response to the command CMD of the memory controller 100 (S510). The memory controller 100 generates a first error vector EV1 including at least one error vector (S515), and the first error vector EV1 is written in the first register 421 (S520). The ECC engine 460 reads the first error vector EV1 from the first register 421 (S530), the ECC engine 460 generates syndrome data SDR based on reset parity data RPRT. The data corrector 490 selectively corrects the error bit of the first error vector EV1 based on the syndrome data SDR to output a second error vector EV2.

The decision circuit 120 in the memory controller 100 checks positions of error bits in the second error vector EV2 (S535). The memory controller 100 determines whether the error bits in the second error vector EV2 are correctable at a system (or rank) level S540). When the error bits in the second error vector EV2 are correctable at a system level (YES in S540), the memory controller 100 determines whether the first error vector EV1 is generated to cover all possible error combinations (S545). When the first error vector EV1 is not generated to cover all possible error combinations (NO in S545), another first error vector EV1 having error bits with different positions and/or different numbers, and processes (S520-S545) are repeated. When the first error vector EV1 is generated to cover all possible error combinations (YES in S545) or when the error bits in the second error vector EV2 are not correctable at a system level (NO in S540), pass or fail is logged (S560). The memory controller 100 issues a command to the semiconductor memory device 200a such that the semiconductor memory device 200a exits from the code validation mode (S570).

Figure 19:
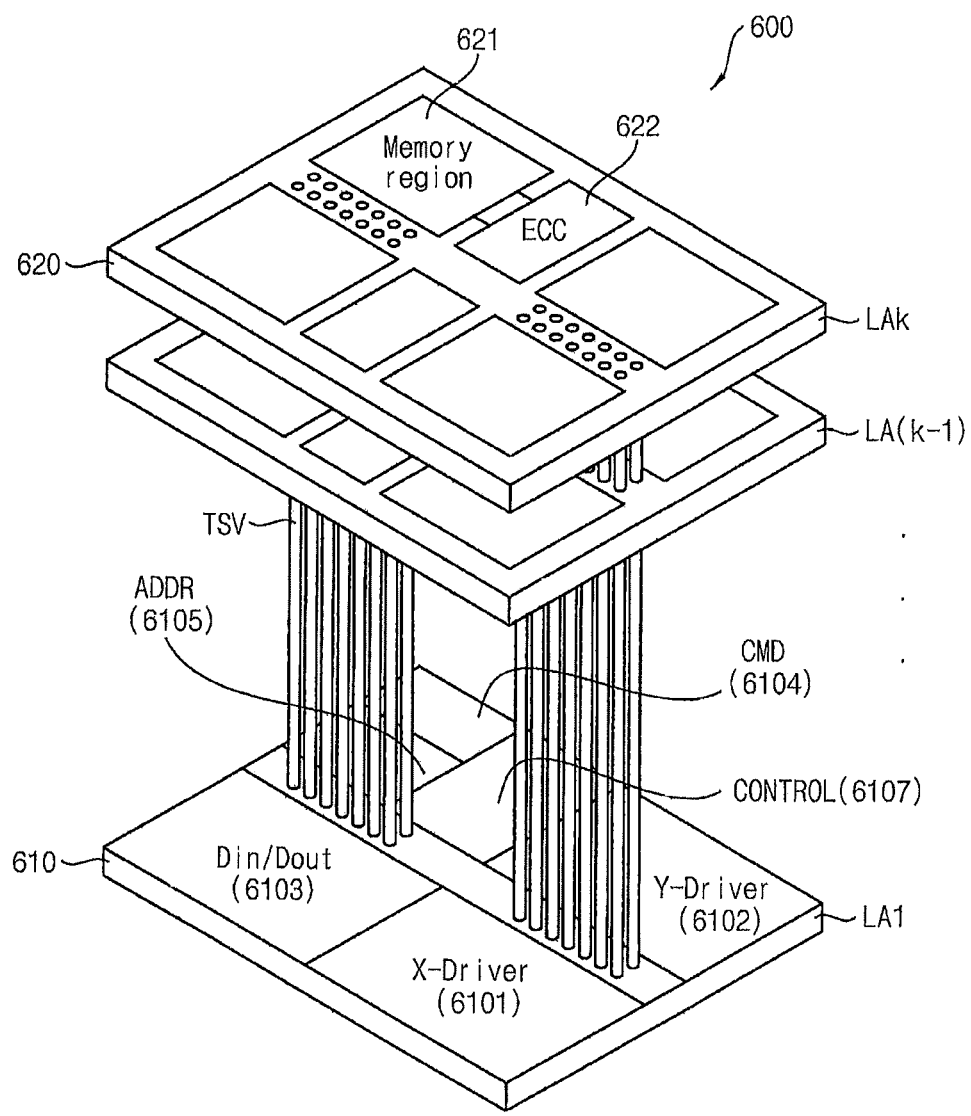
FIG. 19 is a structural diagram illustrating a semiconductor memory device according to example embodiments.

FIG. 19 is a structural diagram illustrating a semiconductor memory device according to example embodiments.

Referring to FIG. 19, a semiconductor memory device 600 may include first through kth semiconductor integrated circuit layers LA1 through LAk (k is an integer equal to or greater than three), in which the lowest first semiconductor integrated circuit layer LA1 is assumed to be an interface or control chip and the other semiconductor integrated circuit layers LA2 through LAk are assumed to be slave chips including core memory chips. The first through kth semiconductor integrated circuit layers LA1 through LAk may transmit and receive signals therebetween through through-silicon-vias (TSVs). The lowest first semiconductor integrated circuit layer LA1 as the interface or control chip may communicate with an external memory controller through a conductive structure formed on an external surface. A description will be made regarding structure and an operation of the semiconductor memory device 600 by mainly using the first semiconductor integrated circuit layer LA1 or 610 as the interface or control chip and the kth semiconductor integrated circuit layer LAk or 620 as the slave chip.

The first semiconductor integrated circuit layer 610 may include various peripheral circuits for driving memory regions 621 provided in the kth semiconductor integrated circuit layer 620. For example, the first semiconductor integrated circuit layer 610 may include a row (X)-driver 6101 for driving word-lines of a memory, a column (Y)-driver 6102 for driving bit-lines of the memory, a data input/output unit (Din/Dout) 6103 for controlling input/output of data, a command buffer (CMD) 6104 for receiving a command CMD from outside and buffering the command CMD, and an address buffer (ADDR) 6105 for receiving an address from outside and buffering the address. The memory region 621 may include a plurality of bank arrays in which a plurality of memory cells are arranged, and each of the plurality of bank arrays may include first memory blocks and a second memory block as described with reference to FIG. 7.

The first semiconductor integrated circuit layer 610 may further include a control logic 6107. The control logic 6107 may access the memory region 621 and may generate control signals for accessing the memory region 621 based on the command from the memory controller.

The kth semiconductor integrated circuit layer 620 may include an error correction circuit 622 that performs an ECC encoding on data to be stored in the memory region 621 and performs an ECC decoding on data read from the memory region 621. The error correction circuit 621 as described with reference to FIGS. 3 through 18, in a code validation mode to verify an ECC implemented in the error correction circuit 622, performs an ECC decoding on a first error vector including at least one error bit based on reset parity data generated therein and outputs a second error vector indicating a result of the ECC decoding. When the first error vector includes a first error bit and a second error bit, the second error vector may include a third error bit generated by mis-correction of the ECC decoding. The memory controller may determine a characteristic of the ECC based on a position of the third error bit.

Figure 20:
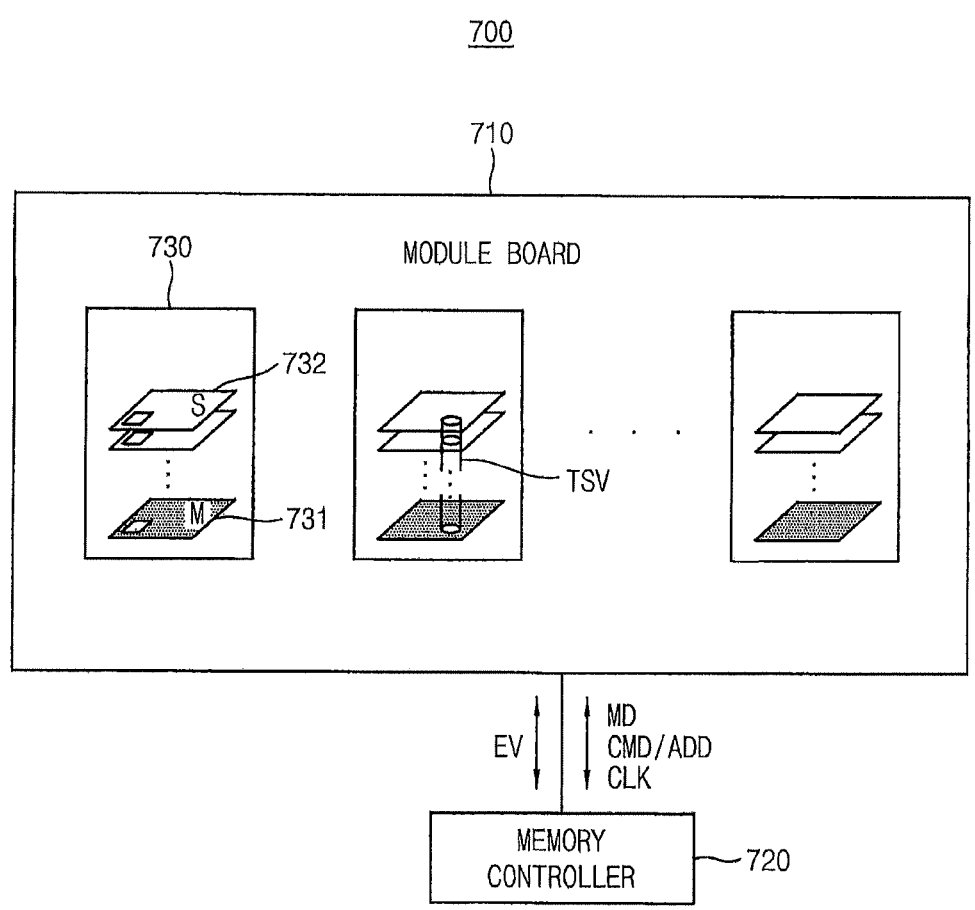
FIG. 20 illustrates a memory system including the semiconductor memory device according to example embodiments.

FIG. 20 illustrates a memory system including the semiconductor memory device according to example embodiments.

Referring to FIG. 20, a memory system 700 may include a memory module 710 and a memory controller 720. The memory module 710 may include at least one semiconductor memory device 730 mounted on a module board. The semiconductor memory device 730 may employ the semiconductor memory device 200a of FIG. 3. For example, the semiconductor memory device 730 may be constructed as a DRAM chip or a MRAM chip. In addition, the semiconductor memory device 730 may include a stack of semiconductor chips. In this case, the semiconductor chips may include at least one master chip 731 and at least one slave chip 732. Signal transfer between the semiconductor chips may occur via through-silicon vias TSV.

The master chip 731 and the slave chip 732 may employ the semiconductor memory device 200a of FIG. 3. Therefore, each of the master chip 731 and the slave chip 732 may include an error correction circuit that, in a code validation mode to verify an ECC implemented in the error correction circuit, performs an ECC decoding on a first error vector including at least one error bit based on reset parity data generated therein and outputs a second error vector indicating a result of the ECC decoding. When the first error vector includes a first error bit and a second error bit, the second error vector may include a third error bit generated by mis-correction of the ECC decoding. The memory controller 720 may determine a characteristic of the ECC based on a position of the third error bit.

The memory module 710 may communicate with the memory controller 720 via a system bus. Main data MD, a command/address CMD/ADDR, and a clock signal CLK may be transmitted and received between the memory module 710 and the memory controller 720 via the system bus. In addition, the memory module 710 may exchange an error vector EV with the memory controller 720 in the code validation mode.

In addition, in embodiments of the present inventive concept, a three dimensional (3D) memory array is provided in semiconductor memory device 730. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. The following patent documents, which are hereby incorporated by reference, describe suitable configurations for the 3D memory arrays, in which the three-dimensional memory array is configured as a plurality of levels, with word-lines and/or bit-lines shared between levels: U.S. Pat. Nos. 7,679,133; 8,553,466; 8,654,587; 8,559,235; and US Pat. Pub. No. 2011/0233648, which are hereby incorporated by reference in their entireties.

Figure 21:
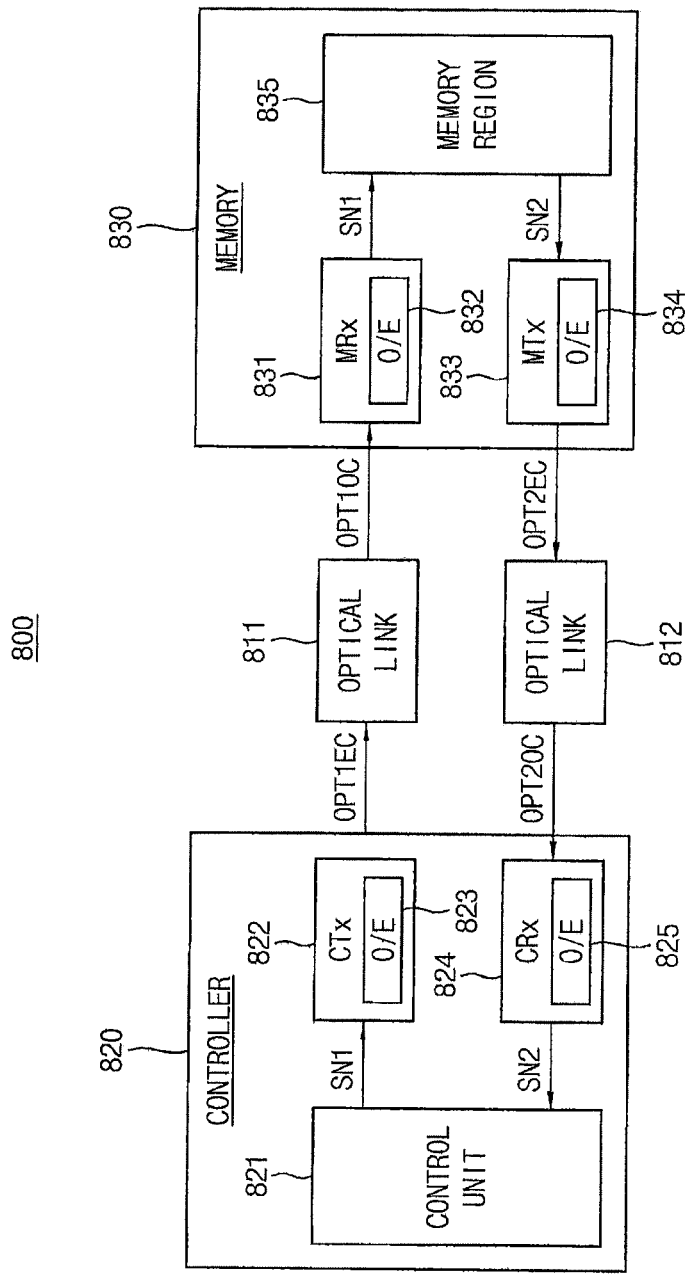
FIG. 21 is a block diagram illustrating a memory system including the semiconductor memory device according to at least one example embodiment.

FIG. 21 is a block diagram illustrating a memory system including the semiconductor memory device according to at least one example embodiment.

Referring to FIG. 21, a memory system 800 may include optical links 811 and 812, a controller 820, and a semiconductor memory device 830. The optical links 811 and 812 interconnect the controller 820 and the semiconductor memory device 830. The controller 820 may include a control unit 821, a first transmitter 822, and a first receiver 824. The control unit 821 may transmit a first electrical signal SN1 to the first transmitter 822. The first electrical signal SN1 may include command signals, clock signals, address signals, or write data transmitted to the semiconductor memory device 830.

The first transmitter 822 may include a first optical modulator 823, and the first optical modulator 823 may convert the first electrical signal SN1 into a first optical transmission signal OTP1EC and may transmit the first optical transmission signal OTP1EC over the optical link 811. The first optical transmission signal OTP1EC may be transmitted by serial communication over the optical link 811. The first receiver 824 may include a first optical demodulator 825, and the first optical demodulator 825 may convert a second optical reception signal OPT2OC received from the optical link 812 into a second electrical signal SN2 and may transmit the second electrical signal SN2 to the control unit 821.

The semiconductor memory device 830 may include a second receiver 831, a memory region 835 having resistive type memory cells or dynamic memory cells, and a second transmitter 834. The second receiver 831 may include a second optical demodulator 832, and the second optical demodulator 832 may convert the first optical reception signal OPT1OC received from the optical link 811 into the first electrical signal SN1 and may transmit the first optical reception signal OPT1OC to the memory region 835.

In the memory region 835, write data is written to the memory cells in response to the first electrical signal SN1, or data read from the memory region 835 is transmitted as a second electrical signal SN2 to the second transmitter 834. In addition, the memory region 835 may include an error correction circuit that, in a code validation mode to verify an ECC implemented in the error correction circuit, performs an ECC decoding on a first error vector including at least one error bit based on reset parity data generated therein and outputs a second error vector indicating a result of the ECC decoding. When the first error vector includes a first error bit and a second error bit, the second error vector may include a third error bit generated by mis-correction of the ECC decoding. The controller 820 may determine a characteristic of the ECC based on a position of the third error bit.

The second electrical signal SN2 may include clock signals and read data transmitted to the memory controller 820. The second transmitter 833 may include a second optical modulator 834, and the second optical modulator 834 may convert the second electrical signal SN2 into the second optical data signal OPT2EC and transmits the second optical data signal OPT2EC over the optical link 812. The second optical transmission signal OTP2EC may be transmitted by serial communication over the optical link 812.

Figure 22:
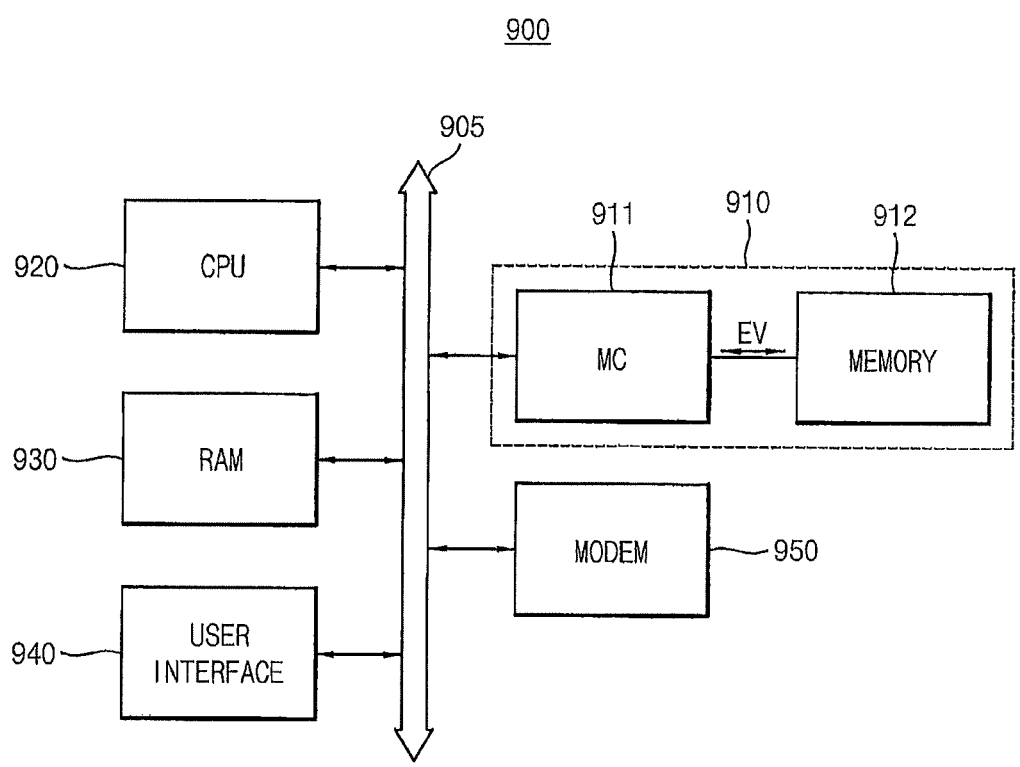
FIG. 22 is a block diagram illustrating a computing system including the semiconductor memory device according to example embodiments.

FIG. 22 is a block diagram illustrating a computing system including the semiconductor memory device according to example embodiments.

Referring to FIG. 22, a computing system 900 may be mounted on a mobile device or a desktop computer. The computing system 900 may include a memory system 910, a central processing unit (CPU) 920, a RAM 930, a user interface 940, and a modem 950 such as a baseband chipset, which are electrically connected to a system bus 905. The computing system 900 may further include an application chipset, a camera image processor (CIS), and an input/output device.

The user interface 940 may be an interface for transmitting data to a communication network or receiving data from the communication network. The user interface 940 may be wired or wireless, and may include an antenna or a wired/wireless transceiver. Data applied through the user interface 940 or the modem 950 or processed by the CPU 920 may be stored in the memory system 910.

The memory system 910 includes a semiconductor memory device 912 such as DRAM and a memory controller 911. Data processed by the CPU 920 or external data is stored in the semiconductor memory device 912. The memory controller 911 and the semiconductor memory device 912 may exchange an error vector in a code validation mode. The semiconductor memory device 912, as described with reference to FIGS. 3 through 18, may include an error correction circuit, in a code validation mode to verify an ECC implemented in the error correction circuit, performs an ECC decoding on a first error vector including at least one error bit based on reset parity data generated therein and outputs a second error vector indicating a result of the ECC decoding. When the first error vector includes a first error bit and a second error bit, the second error vector may include a third error bit generated by mis-correction of the ECC decoding. The memory controller 911 may determine a characteristic of the ECC based on a position of the third error bit.

When the computing system 900 is a device that performs wireless communications, the computing system 900 may be used in a communication system such as code division multiple access (CDMA), global system for mobile communication (GSM), North American multiple access (NADC), or CDMA2000. The computing system 900 may be mounted on an information processing device such as a personal digital assistant (PDA), a portable computer, a web tablet, a digital camera, a portable media player (PMP), a mobile phone, a wireless phone, or a laptop computer.

Figure 23:
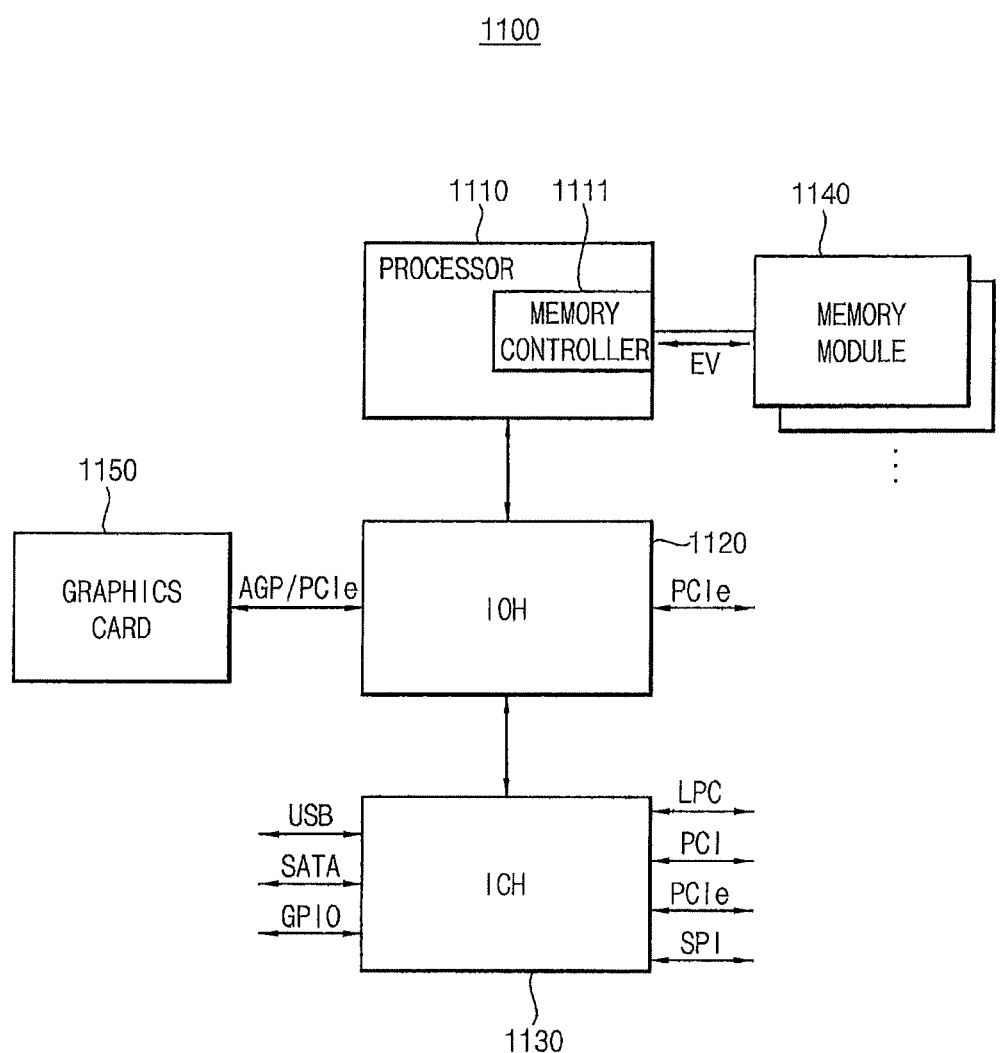
FIG. 23 is a block diagram illustrating a computing system including the semiconductor memory device according to example embodiments.

FIG. 23 is a block diagram illustrating a computing system including the semiconductor memory device according to example embodiments.

Referring to FIG. 23, a computing system 1100 may include a processor 1110, an input/output hub (IOH) 1120, an input/output controller hub (ICH) 1130, at least one memory module 1140 and a graphics card 1150. In some embodiments, the computing system 1100 may be a personal computer (PC), a server, a workstation, a laptop computer, a mobile phone, a smart phone, a personal digital assistant (PDA), a portable multimedia player (PMP), a digital camera, a digital television, a set-top box, a music player, a portable game console, a navigation system, etc.

The processor 1110 may perform various computing functions, such as executing specific software for performing specific calculations or tasks. For example, the processor 1110 may be a microprocessor, a central process unit (CPU), a digital signal processor, or the like. In some embodiments, the processor 1110 may include a single core or multiple cores. For example, the processor 1110 may be a multi-core processor, such as a dual-core processor, a quad-core processor, a hexa-core processor, etc. Although FIG. 23 illustrates the computing system 1100 including one processor 1110, in some embodiments, the computing system 1100 may include a plurality of processors. The processor 1110 may include an internal or external cache memory.

The processor 1110 may include a memory controller 1111 for controlling operations of the memory module 1140. The memory controller 1111 included in the processor 1110 may be referred to as an integrated memory controller (IMC). A memory interface between the memory controller 1111 and the memory module 1140 may be implemented with a single channel including a plurality of signal lines, or may be implemented with multiple channels, to each of which at least one memory module 1140 may be coupled. In some embodiments, the memory controller 1111 may be located inside the input/output hub 1120, which may be referred to as a memory controller hub (MCH).

The memory module 1140 may include a plurality of semiconductor memory devices that store data provided from the memory controller 1111. Each of the plurality of semiconductor memory devices may employ the semiconductor memory device of FIG. 3. Therefore, each of the plurality of semiconductor memory devices may include a memory cell array including dynamic memory cells or resistive memory cells as described with reference to FIGS. 4A to 5. Each of the plurality of semiconductor memory devices may include an error correction circuit that performs an ECC encoding and an ECC decoding on data of the memory cell array. The error correction circuit, in a code validation mode to verify an ECC implemented in the error correction circuit, performs an ECC decoding on a first error vector including at least one error bit based on reset parity data generated therein and outputs a second error vector indicating a result of the ECC decoding. When the first error vector includes a first error bit and a second error bit, the second error vector may include a third error bit generated by mis-correction of the ECC decoding. The memory controller 1111 may determine a characteristic of the ECC based on a position of the third error bit. The memory controller 1111 and each of the semiconductor memory devices may exchange an error vector EV in the code validation mode.

The input/output hub 1120 may manage data transfer between the processor 1110 and devices, such as the graphics card 1150. The input/output hub 1120 may be coupled to the processor 1110 via various interfaces. For example, the interface between the processor 1110 and the input/output hub 1120 may be a front side bus (FSB), a system bus, a HyperTransport, a lightning data transport (LDT), a QuickPath interconnect (QPI), a common system interface (CSI), etc. Although FIG. 23 illustrates the computing system 1100 including one input/output hub 1120, in some embodiments, the computing system 1100 may include a plurality of input/output hubs.

The input/output hub 1120 may provide various interfaces with the devices. For example, the input/output hub 1120 may provide an accelerated graphics port (AGP) interface, a peripheral component interface-express (PCIe), a communications streaming architecture (CSA) interface, etc.

The graphics card 1150 may be coupled to the input/output hub 1120 via AGP or PCIe. The graphics card 1150 may control a display device for displaying an image. The graphics card 1150 may include an internal processor for processing image data and an internal semiconductor memory device. In some embodiments, the input/output hub 1120 may include an internal graphics device along with or instead of the graphics card 1150 outside the input/output hub 1120. The graphics device included in the input/output hub 1120 may be referred to as integrated graphics device. Further, the input/output hub 1120 including the internal memory controller and the internal graphics device may be referred to as a graphics and memory controller hub (GMCH).

The input/output controller hub 1130 may perform data buffering and interface arbitration in order to efficiently operate various system interfaces. The input/output controller hub 1130 may be coupled to the input/output hub 1120 via an internal bus, such as a direct media interface (DMI), a hub interface, an enterprise Southbridge interface (ESI), PCIe, etc. The input/output controller hub 1130 may provide various interfaces with peripheral devices. For example, the input/output controller hub 1130 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 1110, the input/output hub 1120 and the input/output controller hub 1130 may be implemented as separate chipsets or separate integrated circuits. In other embodiments, at least two of the processor 1110, the input/output hub 1120 and the input/output controller hub 1130 may be implemented as a single chipset.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims.

What is claimed is:

1. A memory system comprising:
at least one semiconductor memory device; and
a memory controller configured to control the at least one semiconductor memory device, wherein the at least one semiconductor memory device comprises:
a memory cell array;
an error correction circuit configured to perform an error correction code (ECC) decoding based on data read from the memory cell array in a normal mode; and
a control logic circuit configured to control access to the memory cell array and configured to control the error correction circuit in response to a command from the memory controller,
wherein the error correction circuit is configured to perform the ECC decoding on a first error vector from the memory controller and configured to output a second error vector indicating a result of the ECC decoding when the command directs a code validation mode to test an ECC implemented in the error correction circuit and the first error vector includes at least one predetermined error bit.

2. The memory system of claim 1, wherein the error correction circuit comprises:
a first register configured to store the first error vector in a write operation of the code validation mode;
an ECC engine configured to receive the first error vector, configured to perform the ECC decoding on the first error vector based on predetermined reset parity data and configured to generate syndrome data in a read operation of the code validation mode; and
a data corrector circuit configured to selectively correct the at least one predetermined error bit in the first error vector based on the syndrome data and configured to output the second error vector indicating a capability of the ECC, and
wherein the memory controller comprises:
a decision circuit configured to determine a capability of the ECC at a system level based on position of error bits in the second error vector.

3. The memory system of claim 2, wherein the ECC is capable of correcting one error bit, and
wherein when the first error vector includes the first error bit and a second error bit and the second error vector includes the first error bit, the second error bit and a third error bit which is generated by the ECC decoding, the decision circuit is configured to determine the capability of the ECC based on a position of the third error bit.

4. The memory system of claim 3, wherein the second error vector includes a first sub codeword and a second sub codeword which are divided based on a burst length of the semiconductor memory device, the first sub codeword includes a first chunk and a second chunk divided based on data input/output pads of the semiconductor memory device and the second sub codeword includes a third chunk and a fourth chunk divided based on the data input/output pads of the semiconductor memory device.

5. The memory system of claim 4, wherein when the first error bit is included in the first chunk and the second error bit is included in the second chunk, the decision circuit is configured to determine the first sub codeword as uncorrectable.

6. The memory system of claim 4, wherein when the first error bit and the second error bit are included in the first chunk, the decision circuit is configured to determine the first sub codeword as correctable.

7. The memory system of claim 4, wherein when the third error bit is included in the second sub codeword, the decision circuit is configured to determine the second sub codeword as correctable.

* * * * *